United States Patent
Park et al.

(10) Patent No.: US 11,703,715 B2
(45) Date of Patent: Jul. 18, 2023

(54) DISPLAY DEVICE

(71) Applicant: LG ELECTRONICS INC., Seoul (KR)

(72) Inventors: Jinsin Park, Seoul (KR); Seungse Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 17/657,338

(22) Filed: Mar. 30, 2022

(65) Prior Publication Data

US 2022/0317518 A1 Oct. 6, 2022

(30) Foreign Application Priority Data

Apr. 2, 2021 (KR) .................. 10-2021-0043375

(51) Int. Cl.
| | | |
|---|---|---|
| G02F 1/00 | (2006.01) | |
| G02F 1/13357 | (2006.01) | |
| G02F 1/1333 | (2006.01) | |
| G02F 1/1335 | (2006.01) | |

(52) U.S. Cl.
CPC .. G02F 1/133605 (2013.01); G02F 1/133308 (2013.01); G02F 1/133603 (2013.01); G02F 1/133607 (2021.01); G02F 1/133614 (2021.01)

(58) Field of Classification Search
CPC .. F21S 4/28; F21Y 2103/10; G02F 1/133605; G02F 1/133607; G02F 1/133608; G02F 1/133603; G02F 1/133614
See application file for complete search history.

(56) References Cited

U.S. PATENT DOCUMENTS

2011/0182085 A1* 7/2011 Ko .................. F21S 4/28
                                                                    257/88
2020/0110214 A1* 4/2020 Son .................. G02F 1/1333

FOREIGN PATENT DOCUMENTS

| JP | 2012204025 | 10/2012 |
|---|---|---|
| KR | 1020110087579 | 8/2011 |
| KR | 1020150092808 | 8/2015 |
| KR | 1020160019601 | 2/2016 |
| KR | 1020160051566 | 5/2016 |
| KR | 1020180132370 | 12/2018 |

OTHER PUBLICATIONS

PCT International Application No. PCT/KR2022/004413, International Search Report dated Jul. 25, 2022, 5 pages.

* cited by examiner

*Primary Examiner* — Gerald J Sufleta, II
(74) *Attorney, Agent, or Firm* — Lee, Hong, Degerman, Kang & Waimey PC

(57) ABSTRACT

According to one or more embodiments, a display device may include: a display panel; a frame located behind the display panel, and to which the display panel is coupled; a substrate located between the display panel and the frame, fixed to the frame, and extending along a length direction; a plurality of light sources successively mounted on the substrate along the length direction of the substrate; and a lens extending along the length direction of the substrate to cover the plurality of light sources, and fixed to the substrate, wherein the lens may include: a first dome portion which forms an upper surface, and is convex; a second dome portion which forms an upper surface, and is adjacent to the first dome portion; a receiving portion recessed from a lower surface of the lens toward the upper surface, and in which the plurality of light sources are located.

17 Claims, 22 Drawing Sheets

DISPLAY DEVICE

CROSS-REFERENCE TO RELATED APPLICATION

Pursuant to 35 U.S.C. § 119(a), this application claims the benefit of earlier filing date and right of priority to Korean Patent Application No. 10-2021-0043375, filed on Apr. 2, 2021, the contents of which are all hereby incorporated by reference herein in its entirety.

BACKGROUND

1. Field

Embodiments of the present disclosure relate to a display device.

2. Description of the Related Art

As information society develops, the demand for display devices has also been increased in various forms. In response to this trend, in recent years, various display devices such as Liquid Crystal Display Device (LCD), Organic Light Emitting Diode (OLED), Micro LED, and the like have been researched and used.

Among them, a liquid crystal panel of LCD includes a liquid crystal layer, and a thin-film-transistor (TFT) substrate and a color filter substrate facing each other with the liquid crystal layer interposed therebetween, and the liquid crystal panel may display an image by using light provided from a backlight unit.

Recently, as interest in the image quality of display devices increases, attention is concentrated on color expression or color reproducibility close to true color, and a lot of research has been performed on image quality improvement to improve light uniformity and to implement natural colors.

SUMMARY OF THE INVENTION

An object of embodiments of the present disclosure is to solve the above and other problems. Another object of embodiments of the present disclosure is to provide a display device capable of improving image quality.

Another object of embodiments of the present disclosure is to provide a display device capable of improving luminance and light uniformity of a backlight unit.

Another object of embodiments of the present disclosure is to provide a display device capable of effectively controlling light provided from a backlight unit.

Another object of embodiments of the present disclosure is to provide a display device capable of reducing the number of light sources while improving the luminance of a backlight unit.

According to an embodiment of the present disclosure for achieving the above or other objects, a display device may include: a display panel; a frame located behind the display panel, and to which the display panel is coupled; a substrate located between the display panel and the frame, fixed to the frame, and extending along a length direction; a plurality of light sources successively mounted on the substrate along the length direction of the substrate; and a lens extending along the length direction of the substrate to cover the plurality of light sources, and fixed to the substrate, wherein the lens may include: a first dome portion which forms an upper surface, and is convex; a second dome portion which forms an upper surface, and is adjacent to the first dome portion; a receiving portion recessed from a lower surface of the lens toward the upper surface, and in which the plurality of light sources are located.

BRIEF DESCRIPTION OF THE DRAWINGS

The above and other objects, features and advantages of embodiments of the present disclosure will be more apparent from the following detailed description in conjunction with the accompanying drawings, in which.

DETAILED DESCRIPTION

Figure 1:
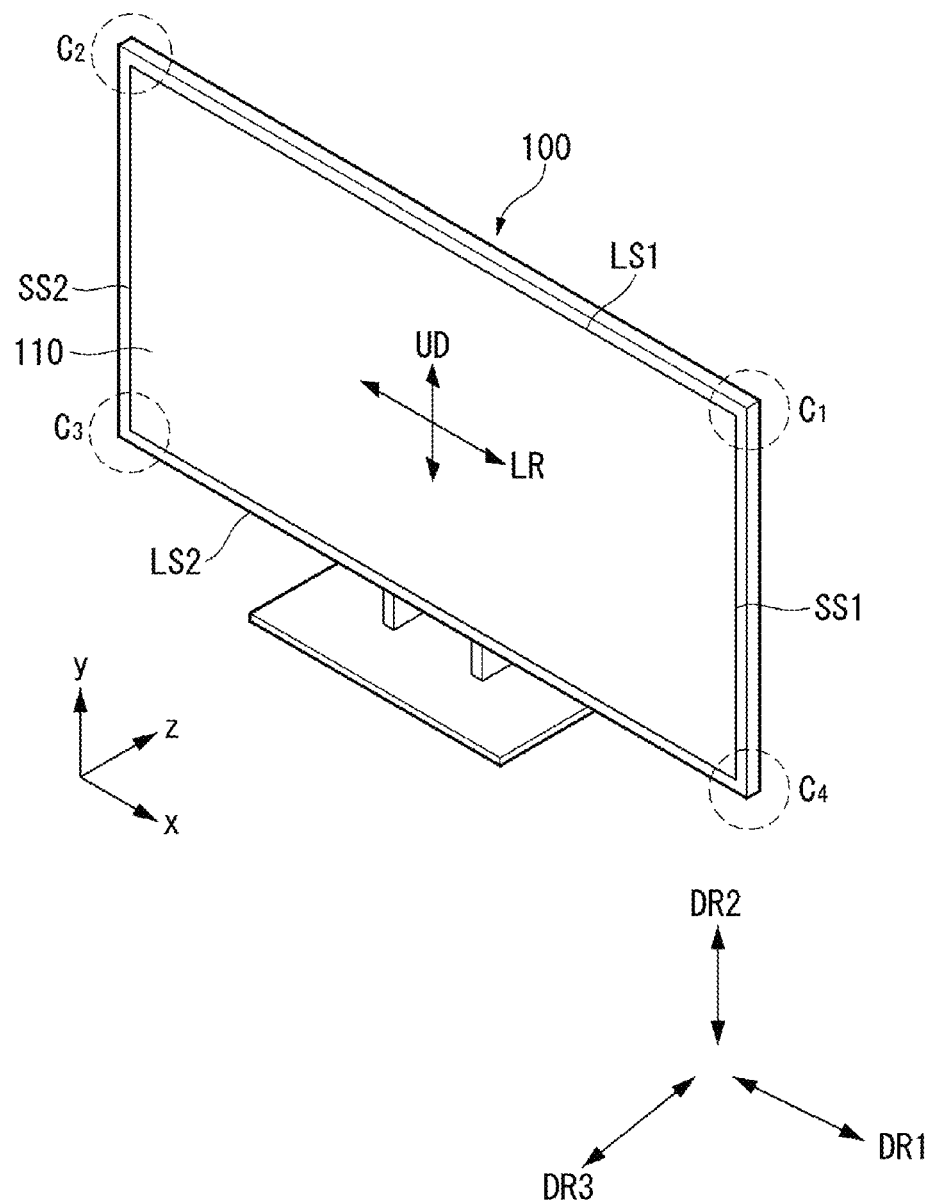
FIGS. 1 to 3 are diagrams illustrating examples of a display device according to embodiments of the present disclosure.

Hereinafter, the embodiments disclosed in the present specification will be described in detail with reference to the accompanying drawings, and the same or similar elements are denoted by the same reference numerals even though they are depicted in different drawings and redundant descriptions thereof will be omitted.

In the following description, with respect to constituent elements used in the following description, the suffixes "module" and "unit" are used or combined with each other only in consideration of ease in the preparation of the specification, and do not have or serve as different meanings.

In addition, in describing the embodiments disclosed in the present specification, if it is determined that detailed descriptions of related known technologies may obscure the gist of the embodiments disclosed in the present specification, the detailed description thereof will be omitted.

In addition, the accompanying drawings are provided only for a better understanding of the embodiments disclosed in the present specification and are not intended to limit the technical ideas disclosed in the present specification. Therefore, it should be understood that the accompanying drawings include all modifications, equivalents and substitutions included in the scope and sprit of the present disclosure.

Hereinafter, a liquid crystal panel (LCD) will be described as an example of a display panel, but it is understood that the display panel applicable to the present disclosure is not limited to the liquid crystal panel.

Referring to FIG. 1, the display device 100 may include a first long side LS1, a second long side LS2 opposite to the first long side LS1, a first short side SS1 adjacent to the first long side LS1 and the second long side LS2, and a second short side SS2 opposite to the first short side SS1.

The first short side area SS1 may be referred to as a first side area, the second short side area SS2 may be referred to as a second side area opposite to the first side area, the first long side LS1 may be referred to as a third side area which is adjacent to the first side area and the second side area and located between the first side area and the second side area, and the second long side LS2 may be referred to as a fourth side area which is adjacent to the first side area and the second side area, located between the first side area and the second side area, and opposite to the third side area.

It is illustrated and described that the lengths of the first and second long sides LS1 and LS2 are longer than the lengths of the first and second short sides SS1 and SS2, but it may be possible that the lengths of the first and second long sides LS1 and LS2 are approximately the same as the lengths of the first and second short sides SS1 and SS2.

A first direction DR1 is a direction parallel to the long side LS1, LS2 of the display device 100, and a second direction DR2 is a direction parallel to the short side SS1, SS2 of the display device 100. A third direction DR3 may be a direction perpendicular to the first direction DR1 and/or the second direction DR2.

The first direction DR1 and the second direction DR2 may be collectively referred to as a horizontal direction (e.g., horizontal plane). In addition, the third direction DR3 may be referred to as a vertical direction.

A side in (or at) which the display device displays an image may be referred to as a forward direction or a front side or front surface. When a display device displays an image, a side in (or at) which an image cannot be observed may be referred to as a rearward direction or a rear side or rear surface.

When the display is viewed from the forward direction or the front side, the side of the first long side LS1 may be referred to as an upper side or an upper surface. Similarly, the side of the second long side LS2 may be referred to as a lower side or a lower surface. Similarly, the side of the first short side SS1 may be referred to as a right side or a right surface, and the side of the second short side SS2 may be referred to as a left side or a left surface.

The first long side LS1, the second long side LS2, the first short side SS1, and the second short side SS2 may each be referred to as an edge of the display device. In addition, a point where the first long side LS1, the second long side LS2, the first short side SS1, and the second short side SS2 meet each other may be referred to as a corner. For example, a point where the first long side LS1 and the first short side SS1 meet may be referred to as a first corner C1, a point where the first long side LS1 and the second short side SS2 meet may be referred to as a second corner C2, a point where the second short side SS2 and the second long side LS2 meet may be referred to as a third corner C3, and a point where the second long side LS2 and the first short side SS1 meet may be referred to as a fourth corner C4.

A direction in which the first short side SS1 faces the second short side SS2 or a direction in which the second short side SS2 faces the first short side SS1 may be referred to as a left-right direction LR. A direction in which the first long side LS1 faces the second long side LS2 or a direction in which the second long side LS2 faces the first long side LS1 may be referred to as a vertical direction UD.

Figure 2:
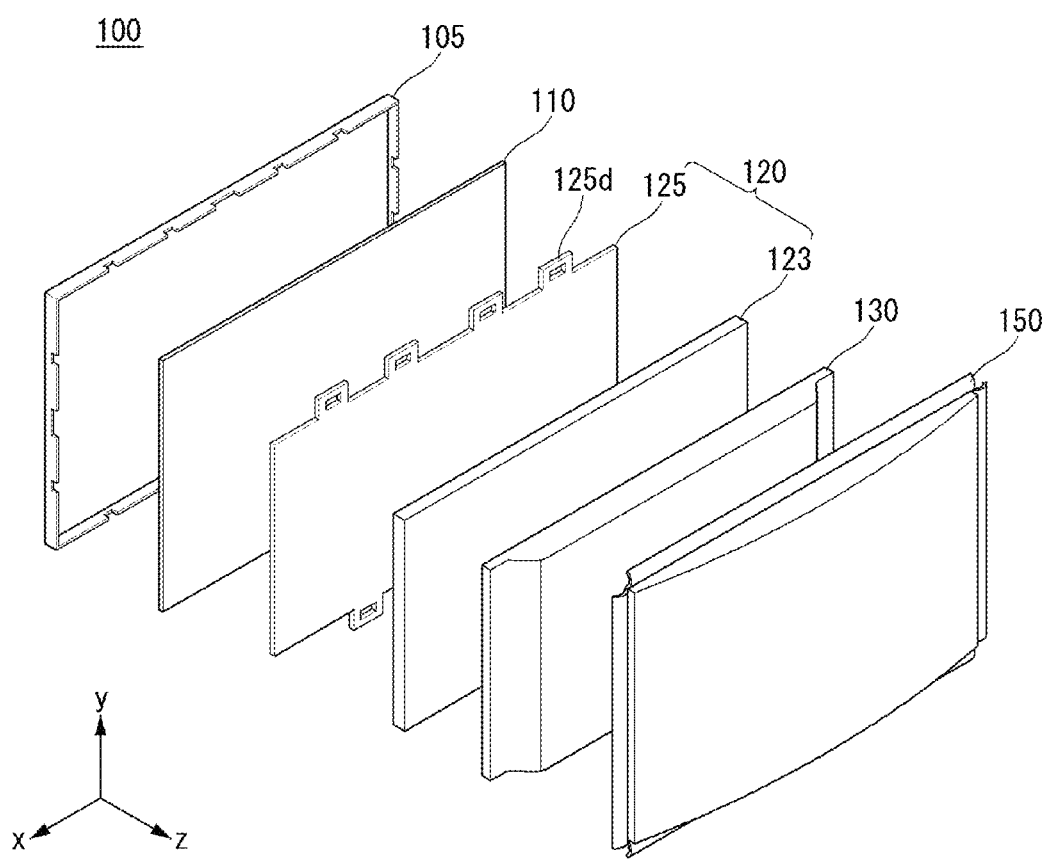

Referring to FIG. 2, a front cover 105 may cover at least a part of the front and side surfaces of the display panel 110. The front cover 105 may be divided into a front cover located in (or at) the front surface of the display panel 110 and a side cover located in (or at) the side surface of the display panel 110. Any one of the front cover and the side cover may be omitted.

The display panel 110 is provided in (or at) the front side of the display device 100 and may display an image. The display panel 110 may display an image by outputting red, green or blue (RGB) color for each pixel by a plurality of pixels according to a timing. The display panel 110 may be divided into an active area in (or at) which an image is displayed and a de-active (or inactive) area in (or at) which an image is not displayed. The display panel 110 may include a front substrate and a rear substrate facing each other with a liquid crystal layer interposed therebetween.

The front substrate may include a plurality of pixels including red (R), green (G), and blue (B) sub-pixels. The front substrate may output light corresponding to a color of red, green, or blue according to a control signal.

The rear substrate may include switching elements. The rear substrate may switch a pixel electrode. For example, the pixel electrode may change the molecular arrangement of the liquid crystal layer according to a control signal applied from the outside (e.g., an external control signal). The liquid crystal layer may include liquid crystal molecules. The liquid crystal molecules may change their arrangement according to a voltage difference generated between the pixel electrode and a common electrode. The liquid crystal layer may transmit or block light provided from a backlight unit 120 to the front substrate.

The backlight unit 120 may be located in the rearward direction of (or behind) the display panel 110. The backlight unit 120 may include light sources. The backlight unit 120 may be coupled to a frame 130 in the forward direction of (or in front of) the frame 130.

The backlight unit 120 may be driven by a full driving method or a partial driving method such as local dimming, and impulsive driving. The backlight unit 120 may include an optical sheet 125 and an optical layer 123. The optical layer 123 may be referred to as an optical module 123 or an optical unit 123.

The optical sheet 125 may allow the light of the light source to be uniformly transmitted to the display panel 110. The optical sheet 125 may be composed of a plurality of layers. For example, the optical sheet 125 may include a prism sheet, a diffusion sheet, or the like.

The optical sheet 125 may include a coupling part 125d. The coupling part 125d may be coupled to the front cover 105, the frame 130, and/or the back cover 150. Alternatively, the coupling part 125d may be fastened to a structure formed in or coupled to the front cover 105, the frame 130, and/or the back cover 150.

The frame 130 may serve to support components of the display device 100. For example, a component such as the backlight unit 120 may be coupled to the frame 130. The frame 130 may be made of a metal material such as an aluminum alloy.

The back cover 150 may be located in (or at) the rear surface or in the rearward direction of the display device 100. The back cover 150 may be coupled to the frame 130 and/or the front cover 105. For example, the back cover 150 may be an injection molding product made of a resin material.

Figure 3:
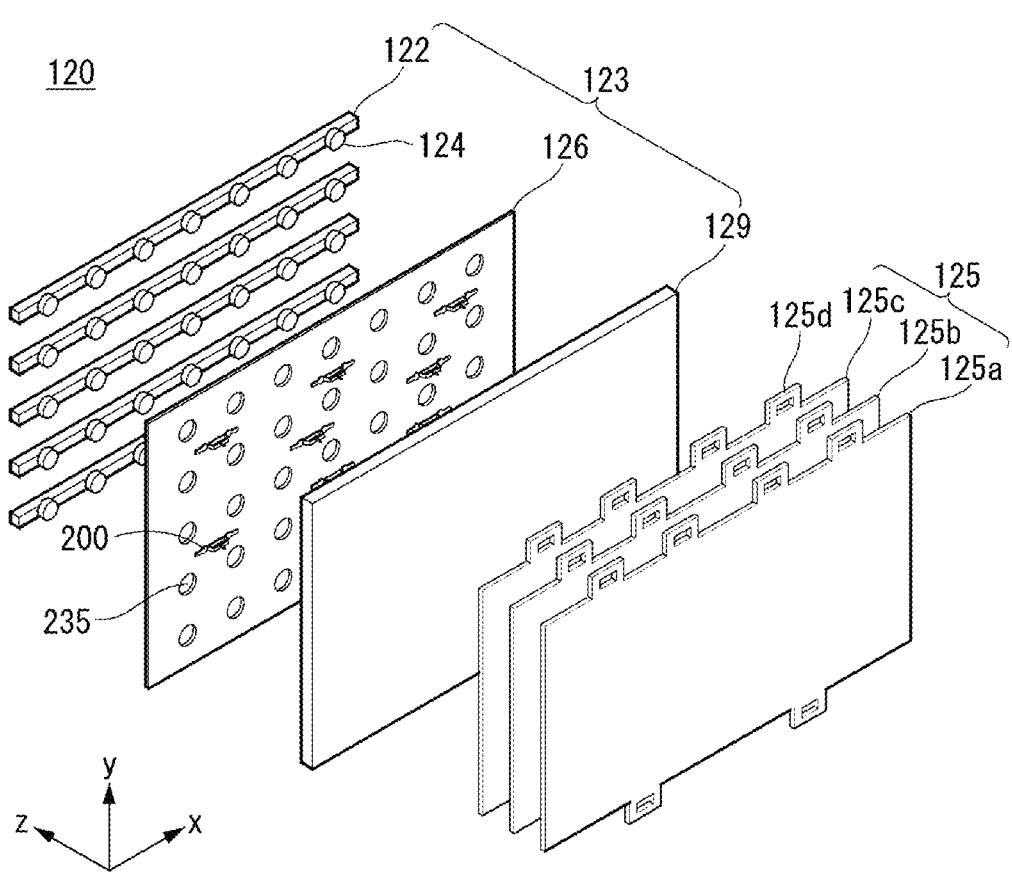

Referring to FIG. 3, the backlight unit 120 may include an optical layer 123 including a substrate 122, at least one optical assembly 124, a reflective sheet 126, and a diffusion plate 129, and an optical sheet 125 located in the front side of (or in front of) the optical layer 123. The configuration of the backlight unit 120 is not limited thereto.

The substrate 122 may be configured in the form of a plurality of straps that extend along a first direction and are spaced apart from each other by a certain distance in a second direction orthogonal to the first direction.

At least one optical assembly 124 may be mounted on the substrate 122. An electrode pattern for connecting an adapter and the optical assembly 124 may be formed on the substrate 122. For example, a carbon nanotube electrode pattern for connecting the optical assembly 124 and the adapter may be formed on the substrate 122.

The substrate 122 may be formed of at least one of polyethylene terephthalate (PET), glass, polycarbonate (PC), or silicon. The substrate 122 may be a printed circuit board (PCB) on which at least one optical assembly 124 is mounted.

The optical assembly 124 may be disposed on the substrate 122 while having a certain interval in the first direction. A diameter of the optical assembly 124 may be greater than a width of the substrate 122. That is, the diameter of the optical assembly 124 may be greater than the length of the substrate 122 in the second direction.

The optical assembly 124 may be a light emitting diode (LED) chip or a light emitting diode package including at least one light emitting diode chip.

The optical assembly 124 may include a colored LED or a white LED that emits at least one color among colors such as red, blue, and green. The colored LED may include at least one of a red LED, a blue LED, or a green LED.

The reflective sheet 126 may be located in the front side of (or in front of) the substrate 122. The reflective sheet 126 may be located in an area of the substrate 122 excluding (or apart from) the area where the optical assembly 124 is formed. The reflective sheet 126 may have a plurality of through holes 235.

The reflective sheet 126 may reflect the light emitted from the optical assembly 124 toward the front side. In addition, the reflective sheet 126 may reflect the light reflected from the diffusion plate 129 again.

The reflective sheet 126 may include at least one of metal or metal oxide which are reflective materials. For example, the reflective sheet 126 may include a metal having a high reflectance such as at least one of Al, Ag, Au, and TiO2 and/or a metal oxide.

A resin may be deposited or coated on the optical assembly 124 and/or the reflective sheet 126. The resin may serve to diffuse light emitted from the optical assembly 124. The diffusion plate 129 may diffuse light emitted from the optical assembly 124 upward.

The optical sheet 125 may be located in the forward direction of (or in front of) the diffusion plate 129. The rear surface of the optical sheet 125 may be in close contact with the diffusion plate 129, and the front surface of the optical sheet 125 may be in close contact with or adjacent to the rear surface of the display panel 110.

The optical sheet 125 may include at least one sheet. Specifically, the optical sheet 125 may include one or more prism sheets and/or one or more diffusion sheets. A plurality of sheets included in the optical sheet 125 may be in a state of being adhered to each other and/or in close contact with each other.

The optical sheet 125 may be composed of a plurality of sheets having different functions. For example, the optical sheet 125 may include first to third optical sheets 125a to 125c. For example, the first optical sheet 125a may be a diffusion sheet, and the second and third optical sheets 125b and 125c may each be a prism sheet. The number and/or position of the diffusion sheet(s) and the prism sheet(s) may be changed.

The diffusion sheet may prevent light emitted from the diffusion plate from being partially concentrated, thereby making light distribution more uniform. The prism sheet may condense light emitted from the diffusion sheet to provide light to the display panel 110.

The coupling part 125d may be formed in at least one of sides or edges of the optical sheet 125. The coupling part 125d may be formed in at least one of the first to third optical sheets 125a to 125c.

The coupling part 125d may be formed in (or at) the long side of the optical sheet 125. The coupling part 125d formed in the first long side and the coupling part 125d formed in the second long side may be asymmetric. For example, the position and/or the number of the coupling part 125d in (or at) the first long side and that of the coupling part 125d in (or at) the second long side may be different from each other.

Figure 4:
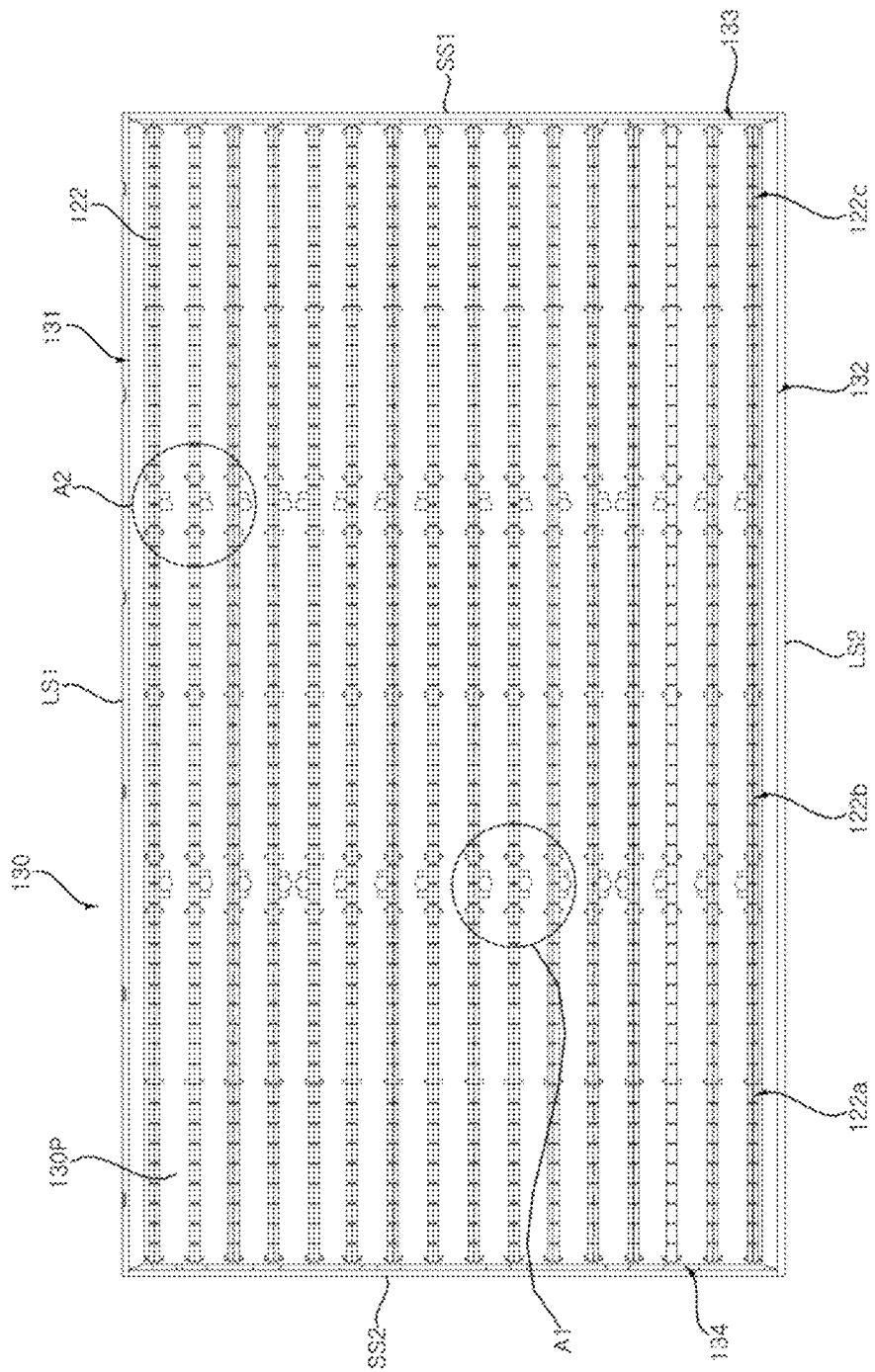
FIGS. 4 to 9 are diagrams illustrating examples of a backlight unit providing light to a display device according to embodiments of the present disclosure.

Referring to FIG. 4, the frame 130 may include the first long side LS1, the second long side LS2, the first short side SS1, and the second short side SS2. The frame 130 may include a flat plate part 130P and inclined parts 131, 132, 133, and 134. The flat plate part 130P may form a central area of the frame 130. In order to improve the rigidity of the frame 130, the flat plate part 130P may be pressed to form a forming part 130F (refer to FIG. 8) that is bent. The inclined parts 131, 132, 133, and 134 may form a circumference of the frame 130.

The inclined parts may include a first inclined part 131, a second inclined part 132, a third inclined part 133, and a fourth inclined part 134. The edge of the first inclined part 131 may form the first long side LS1, the edge of the second inclined part 132 may form the second long side LS2, the edge of the third inclined part 133 may form the first short side SS1, and the edge of the fourth inclined part 134 may form the second short side SS2.

The substrate 122 may be extended long (or elongated, or may extend along a length direction). The substrate 122 may be extended long along the first long side LS1 or the second long side LS2 of the frame 130. The length direction of the substrate 122 may be parallel to the first long side LS1 or the second long side LS2 of the frame 130. The substrate 122 may be plural. A plurality of substrates 122 may be sequentially (or successively) disposed in the vertical direction of the frame 130 while maintaining a constant interval. For example, sixteen substrates 122 may be sequentially (or successively) disposed in the vertical direction of the frame 130 at an interval of 60 mm.

The substrate 122 may include a first substrate 122a, a second substrate 122b, and a third substrate 122c. The first substrate 122a may be disposed to be adjacent to the second short side SS2 and to be extended long in (or to extend along) a direction in which the second short side SS2 faces the first short side SS1. The third substrate 122c may be disposed to be adjacent to the second short side SS2 and to be extended long in (or to extend along) a direction in which the first short side SS1 faces the second short side SS2. The second substrate 122b may be disposed between the first substrate 122a and the third substrate 122c. The first substrate 122a and the second substrate 122b may receive power from a first area A1, and the third substrate 122c may receive power from a second area A2.

Figure 5:
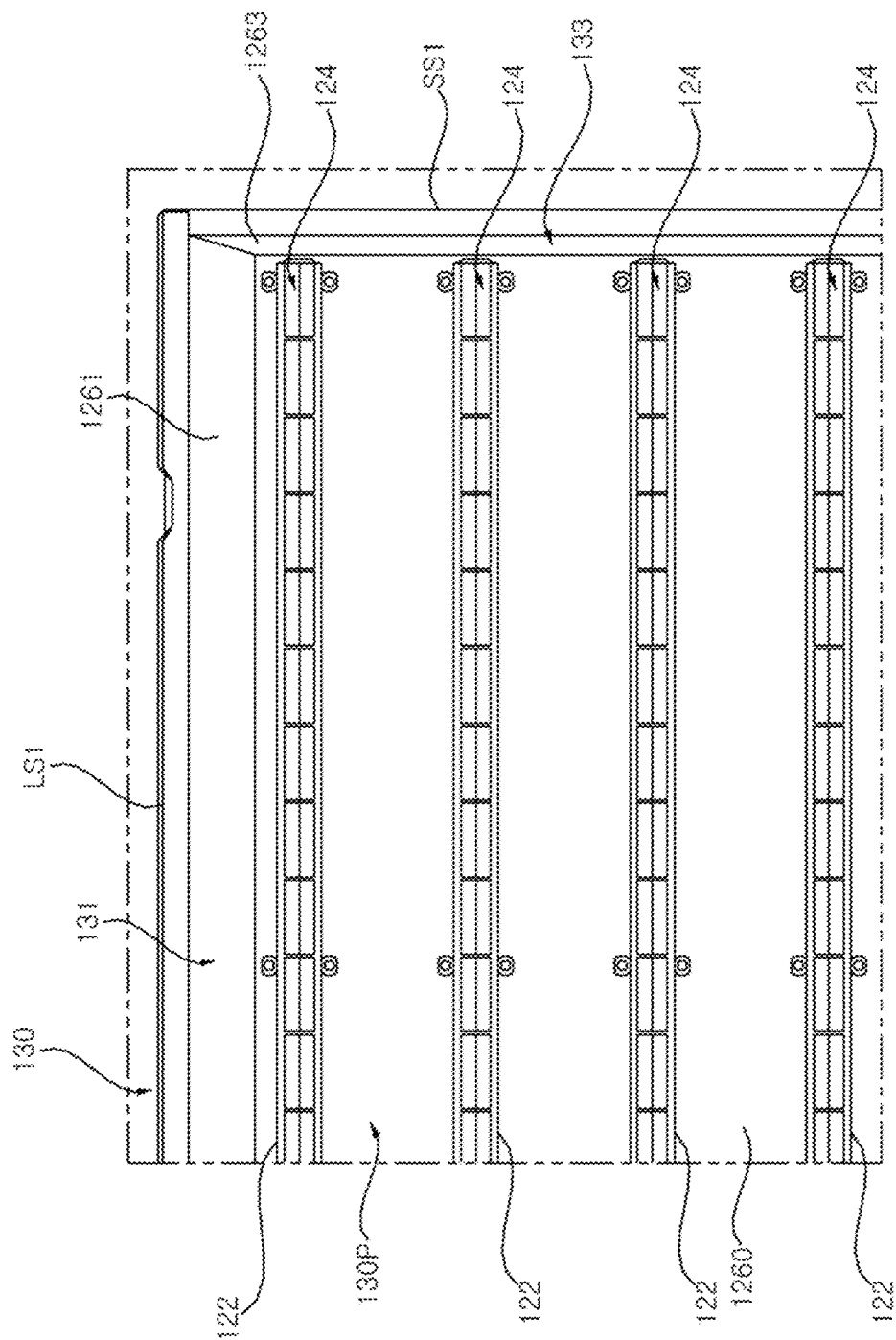

Referring to FIG. 5, the reflective sheet 126 may be located in the frame 130. The reflective sheet 126 may include a central portion 1260 and a side portion 1261, 1263. The central portion 1260 may be located in (or at) the flat plate part 130P of the frame 130, and the side portion 1261, 1263 may be located in (or at) the inclined part 131, 133 of the frame 130.

The optical assembly 124 may be mounted in the substrate 122. The optical assembly 124 may be plural. A plurality of optical assemblies 124 may be sequentially (or successively) disposed along the length direction of the substrate 122. The optical assembly 124 may have an elongated bar-shape.

Figure 6:
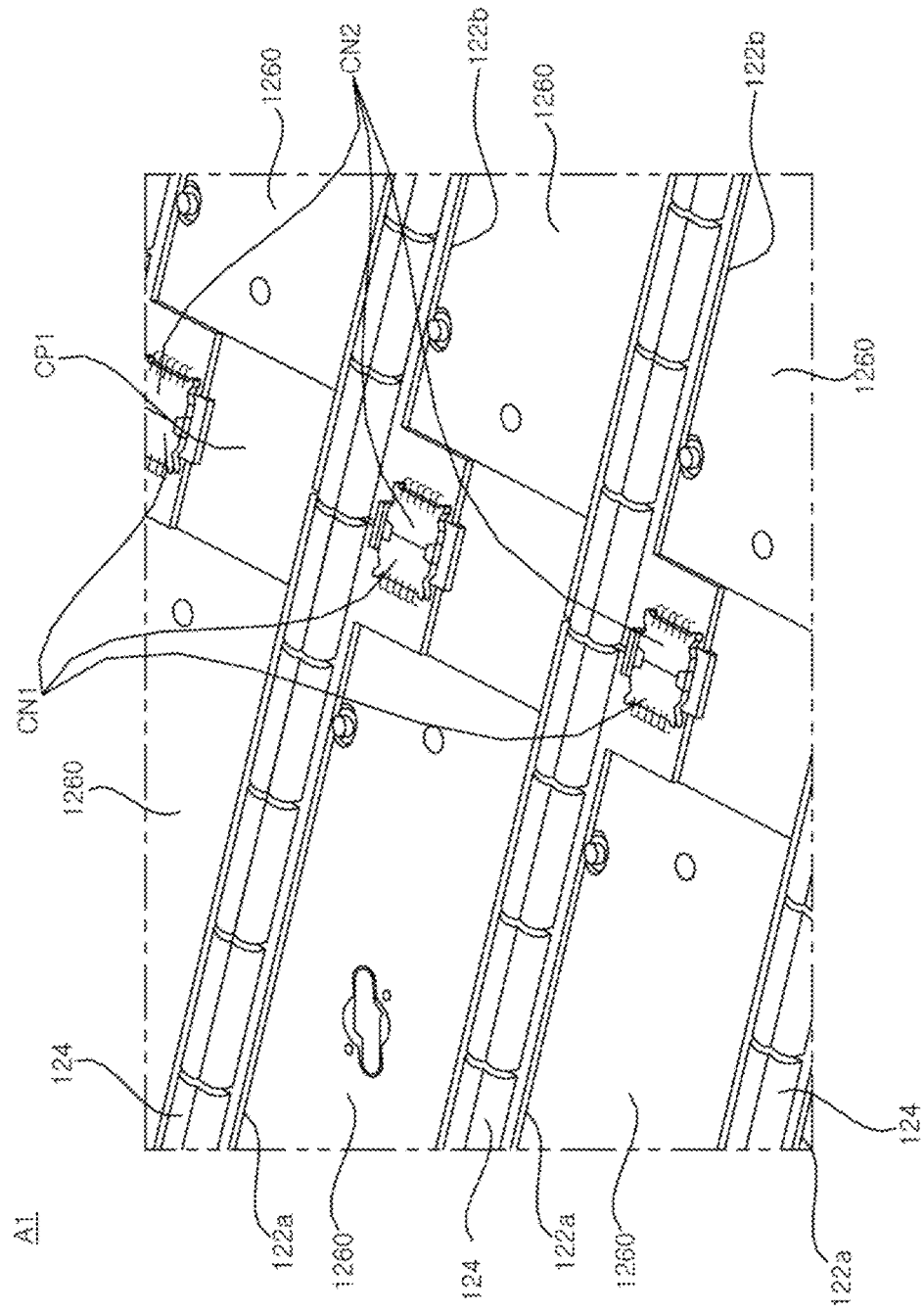

Referring to FIG. 6, a first power substrate CP1 may be located in the frame 130 (refer to FIG. 4) while intersecting with the substrates 122*a* and 122*b*. The first power substrate CP2 may be located between the frame 130 and the substrates 122*a* and 122*b*. The first power substrate CP1 may be accommodated in a space which is formed by recessing the frame 130.

Connectors CN1 and CN2 may be mounted in (or at) the first power substrate CP1. The first substrate 122*a* may be electrically connected (or coupled) to the first power substrate CP1 by a first connector CN1. The second substrate 122*b* may be electrically connected (or coupled) to the first power substrate CP1 by a second connector CN2.

The central portion 1260 of the reflective sheet 126 (refer to FIG. 3) may be located between the substrates 122*a* and 122*b*. The central portion 1260 of the reflective sheet 126 may be located in (or at) the first power substrate CP1. When the reflective layer is spread on the first power substrate CP1, the reflective sheet 126 on the first power substrate CP1 may be omitted.

Figure 7:
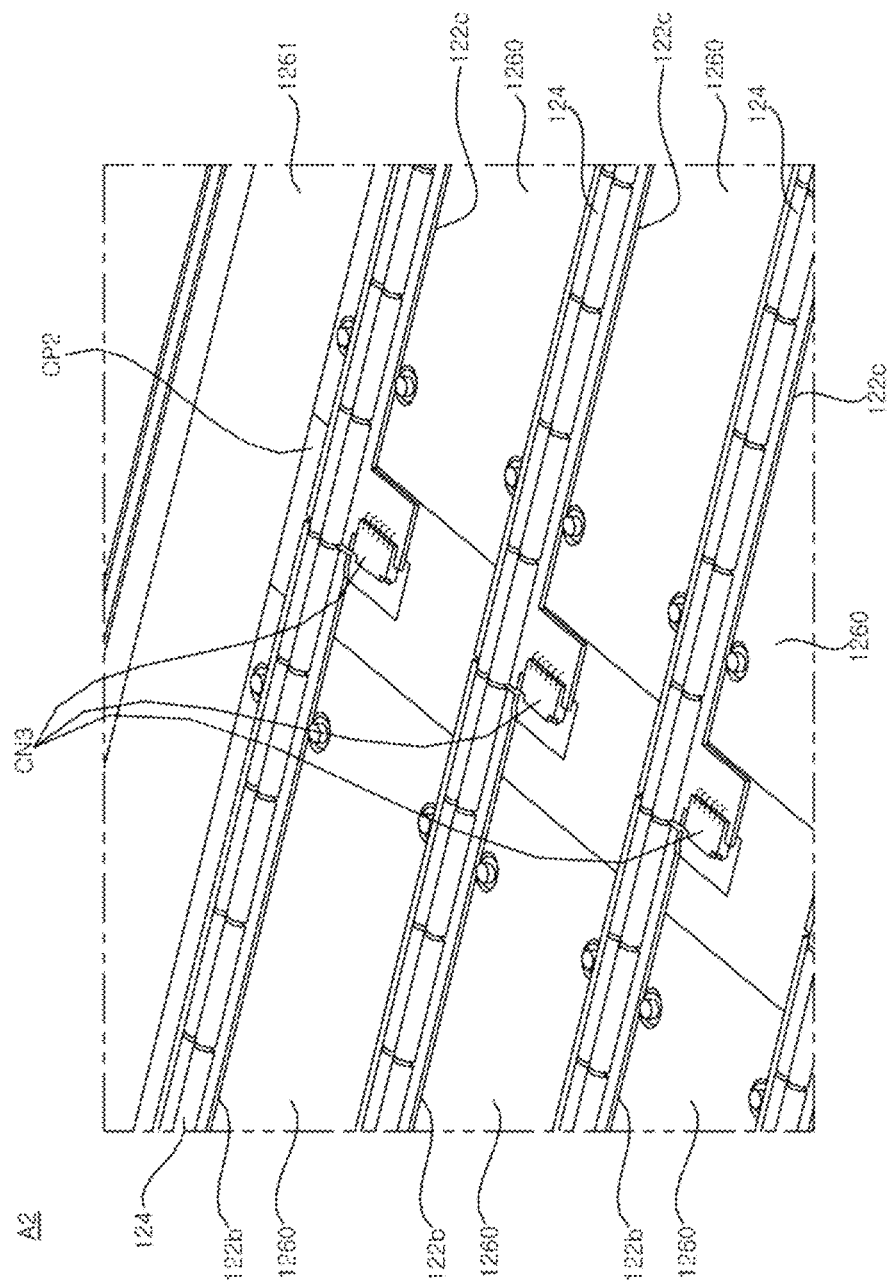

Referring to FIG. 7, a second power substrate CP2 may be located in the frame 130 while intersecting with the substrates 122*b* and 122*c*. The second power substrate CP2 may be located between the frame 130 and the substrates 122*b* and 122*c*. The second power substrate CP2 may be accommodated in a space which is formed by recessing the frame 130.

Connectors CN3 may be mounted on the second power substrate CP2. A third substrate 122*c* may be electrically connected (or coupled) to the second power substrate CP2 by a third connector CN3.

The central portion 1260 of the reflective sheet 126 (refer to FIG. 3) may be located between the substrates 122*b* and 122*c*. The central portion 1260 of the reflective sheet 126 may be located on (or at) the second power substrate CP2. When the reflective layer is spread on the second power substrate CP2, the reflective sheet 126 on the second power substrate CP2 may be omitted.

Figure 8:
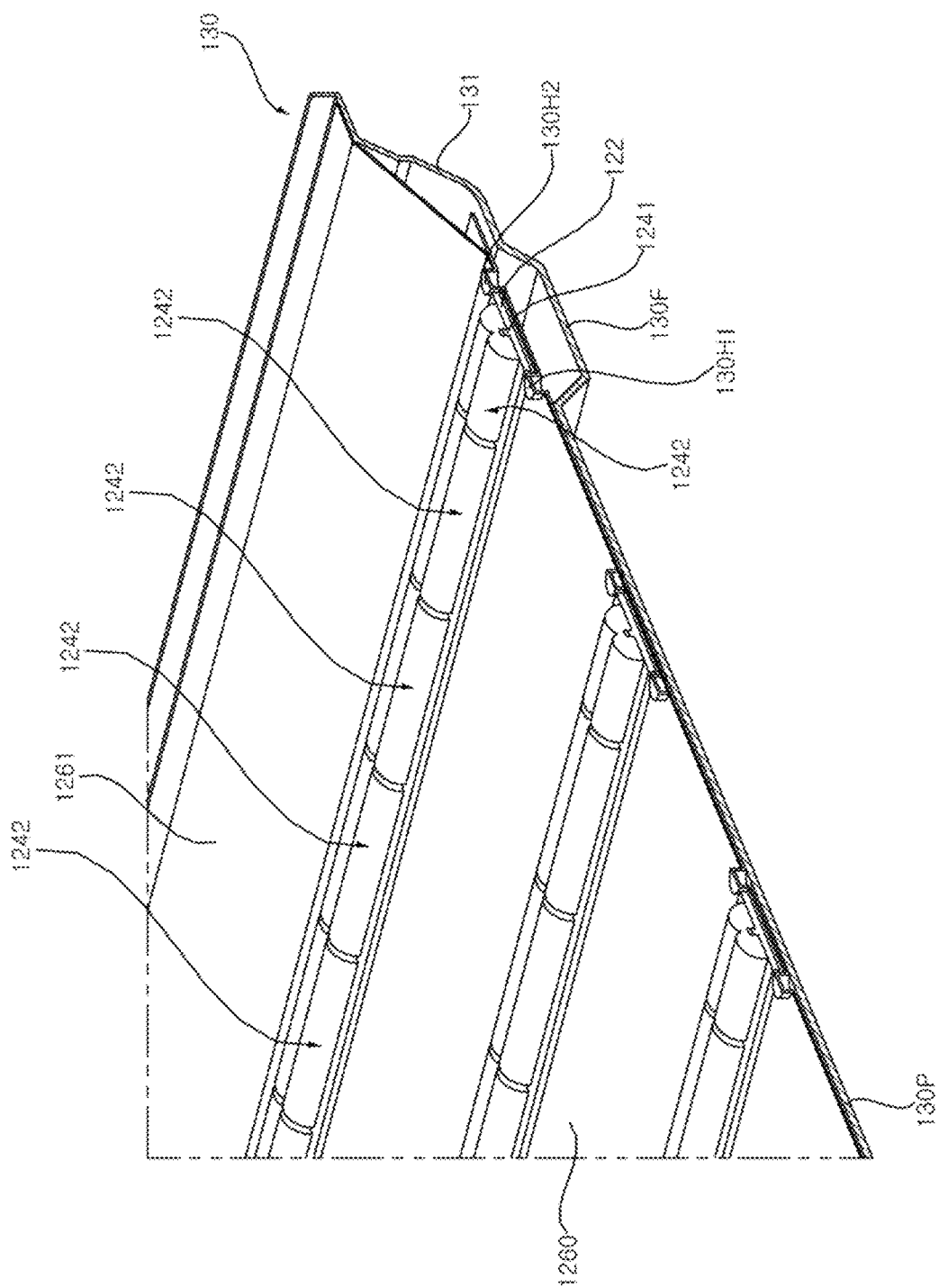

Referring to FIG. 8, the substrate 122 may be located on (or at) the flat plate part 130P. The flat plate part 130P may include holders 130H1 and 130H2. The holders 130H1 and 130H2 may be located adjacent to or in contact with both sides of the substrate 122. The position of the substrate 122 may be fixed by the holders 130H1 and 130H2. A plurality of light sources 1241 may be mounted on the substrate 122. A plurality of light sources 1241 may be sequentially (or successively) disposed on the substrate 122 along the length direction of the substrate 122 while maintaining a constant interval. For example, the light source 1241 may be an LED.

The lens 1242 may be mounted or fixed on (or at) the substrate 122 while covering the light source 1241. The lens 1242 may have an elongated bar shape. For example, the length of the lens 1242 may be 20 to 25 millimeters, the width of the lens 1242 may be 10 to 12 millimeters, and the height of the lens 1242 may be 3 to 5 millimeters. One lens 1242 may cover a plurality of light sources 1241. For example, one lens 1242 may cover 4 to 5 light sources 1241.

Figure 9:
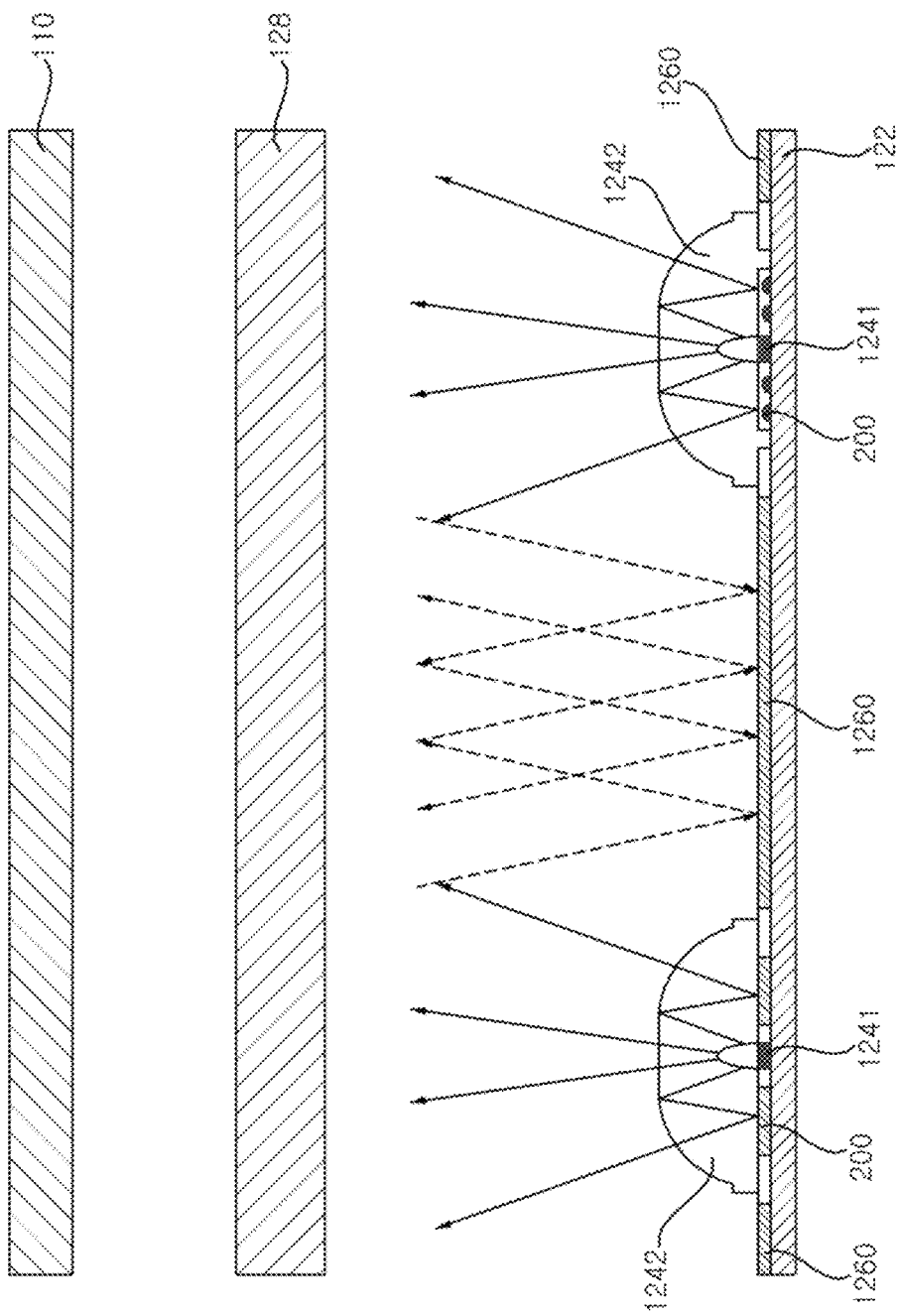

Referring to FIG. 9, light provided from the light source 1241 may be refracted or reflected through the lens 1242 and spread at a wider beam angle than the light source 1241. For example, the light source 1241 may be a blue LED. The light provided from the light source 1241 may be, for example, blue-based light.

The reflective sheet 1260 may be located on (or at) the substrate 122. The reflective sheet 1260 may have (or may be in the form of) a reflective material coated on the substrate 122 to form an upper surface of the substrate 122.

The optical sheet 128 may be located between the display panel 110 and the light source 1241. For example, the optical sheet 128 may include a green-based phosphor and/or a red-based phosphor. The optical sheet 128 may be referred to as a Quantum Dot (QD) sheet. For example, the distance between the light source 1241 and the optical sheet 128 may be 10 mm or less.

Light provided from the light source 1241 and passing through the lens 1242 may be reflected from the reflective sheet 1260 and directed to the optical sheet 128, and the light reflected from the optical sheet 128 and directed toward the reflective sheet may be reflected back to the optical sheet 128 by the reflective sheet 1260. Light provided from the light source 1241 may be recycled (or cycled) between the light source 1241 and the optical sheet 128 through the lens 1242.

The optical pattern 200 may be located or formed on (or at) the substrate 122 between the substrate 122 and the lens 1242. The optical pattern 200 may include a yellow-based phosphor. The optical pattern 200 may be referred to as a reflective pattern 200, an absorbing light pattern 200, or a changing light pattern 200. The optical pattern 200 may be formed on the substrate 122 in various shapes. Accordingly, the color difference of the light provided to the display panel 110 may be improved.

Figure 10:
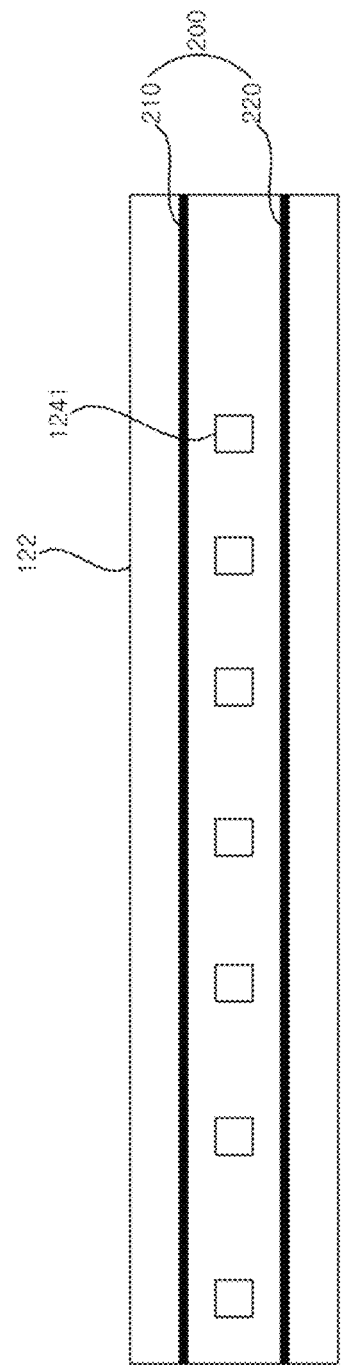
FIGS. 10 to 15 are diagrams illustrating examples of a light source and a substrate according to embodiments of the present disclosure.

Referring to FIG. 10, a plurality of light sources 1241 may be sequentially (or successively) mounted on (or at) the substrate 122 in (or along) the length direction of the substrate 122 while maintaining a constant interval. The optical pattern 200 may be extended long on the substrate 122 in (or may extend along) a direction parallel to the length direction of the substrate 122. The first optical line 210 (of the optical pattern 200) may be located between the light source 1241 and one long side of the substrate 122, and the second optical line 220 (of the optical pattern 200) may be located between the light source 1241 and the other long side of the substrate 122. One long side of the substrate 122 may face the other long side of the substrate 122 with respect to the light source 1241.

For example, the optical lines of the optical pattern 200 may include a yellow phosphor. As another example, the optical lines of the optical pattern 200 may include a black material. Material or phosphor contained in the optical lines of the optical pattern 200 for light control may vary.

Figure 11:
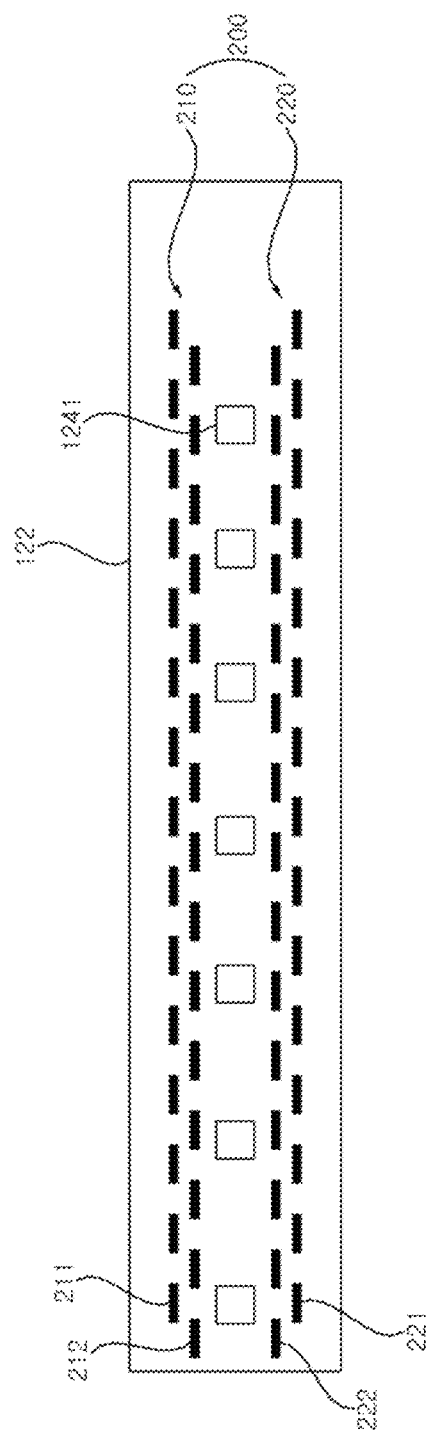

Referring to FIG. 11, a plurality of light sources 1241 may be sequentially (or successively) mounted on (or at) the substrate 122 in (or along) the length direction of the substrate 122 while maintaining a constant interval. The optical pattern 200 may be formed of a plurality of segments. The optical pattern 200 may be distributed on the substrate 122 as a whole in a direction parallel to the length direction of the substrate 122.

The first optical pattern 210 may be located between the light source 1241 and one long side of the substrate 122, and the second optical pattern 220 may be located between the light source 1241 and the other long side of the substrate 122. One long side of the substrate 122 may face the other long side of the substrate 122 with respect to the light source 1241.

The first optical pattern 210 may include a first plurality of segments 211 and a second plurality of segments 212. The first plurality of segments 211 form a dotted line and may be located along one long side of the substrate 122. The second plurality of segments 212 form a dotted line and may be located between the light sources 1241 and the first plurality of segments 211. The second plurality of segments 212 and the first plurality of segments 211 may be alternately disposed.

The second optical pattern 220 may include a third plurality of segments 221 and a fourth plurality of segments 222. The third plurality of segments 221 form a dotted line and may be located along the other long side of the substrate 122. The fourth plurality of segments 222 may form a dotted line and may be located between the light sources 1241 and the third plurality of segments 221. The fourth plurality of segments 222 and the third plurality of segments 221 may be alternately disposed.

For example, the segments of the optical pattern 200 may include a yellow phosphor. As another example, the segments 200 of the optical pattern may include a black material. Material or phosphor contained in the segments of the optical pattern 200 for light control may vary.

Figure 12:
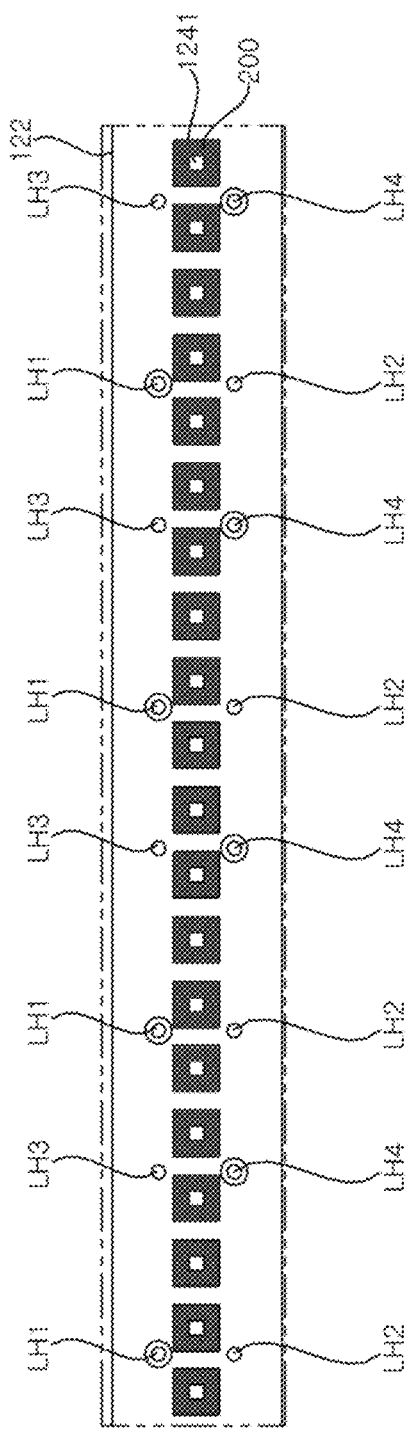

Referring to FIG. 12, the optical pattern 200 may be referred to as an optical layer 200. The optical layer 200 may be referred to as an absorbing light layer 200, a reflective layer 200, or a changing light layer 200. The optical layer 200 may be formed around the light source 1241. For example, the optical layer 200 may be located on the substrate 122 and may have a rectangular shape surrounding (or to surround) the light source 1241.

A leg hole LH may be formed on the substrate 122. The leg hole LH may be formed while the substrate 122 is recessed or stepped down (or pressed). A plurality of leg holes LH may be formed. The first leg hole LH1 may face the second leg hole LH2 and the light source 1241. A depth of the first leg hole LH1 may be greater than a depth of the second leg hole LH2. For example, the second leg hole LH2 may be stepped down by one step, and the first leg hole LH1 may be stepped down by two steps. The third leg hole LH3 may face the fourth leg hole LH4 and the light source 1241. A depth of the fourth leg hole LH4 may be greater than a depth of the third leg hole LH3. For example, the third leg hole LH3 may be stepped down by one step, and the fourth leg hole LH4 may be stepped down by two steps.

For example, the optical layer 200 may include a yellow phosphor. As another example, the optical layer 200 may include a black material. Material or phosphor contained in the optical layer 200 for light control may vary.

Figure 13:
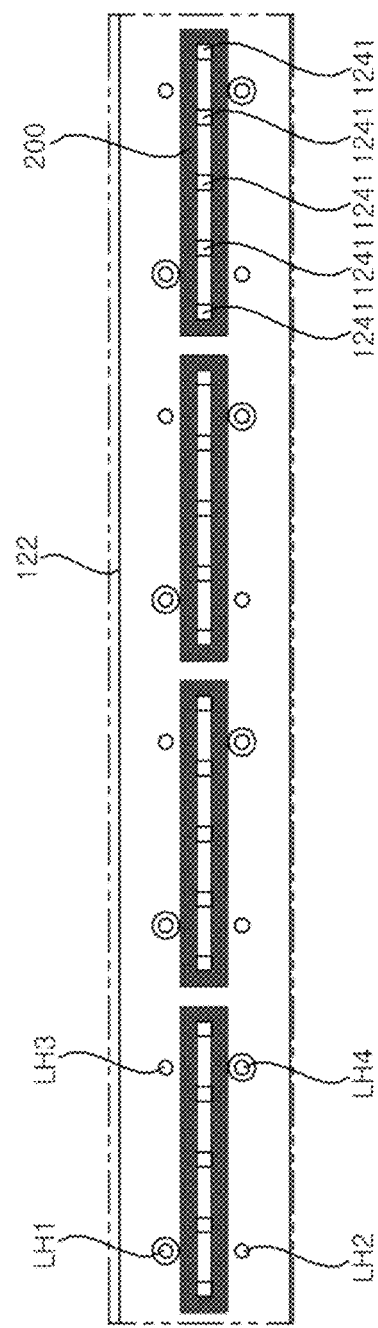

Referring to FIG. 13, the optical layer 200 may be formed around the light source 1241. For example, the optical layer 200 may be located on the substrate 122 and may have a rectangular shape surrounding (or to surround) the light source 1241. The optical layer 200 may have a rectangular shape surrounding (or to surround) a plurality of light sources 1241. For example, the optical layer 200 may have an elongated rectangular shape surrounding (or to surround) five light sources 1241. A substrate 122 may have no optical layer 200 existing between adjacent light sources 1241.

For example, the optical layer 200 may include a yellow phosphor. As another example, the optical layer 200 may include a black material. Material or phosphor contained in the optical layer 200 for light control may vary.

Figure 14:
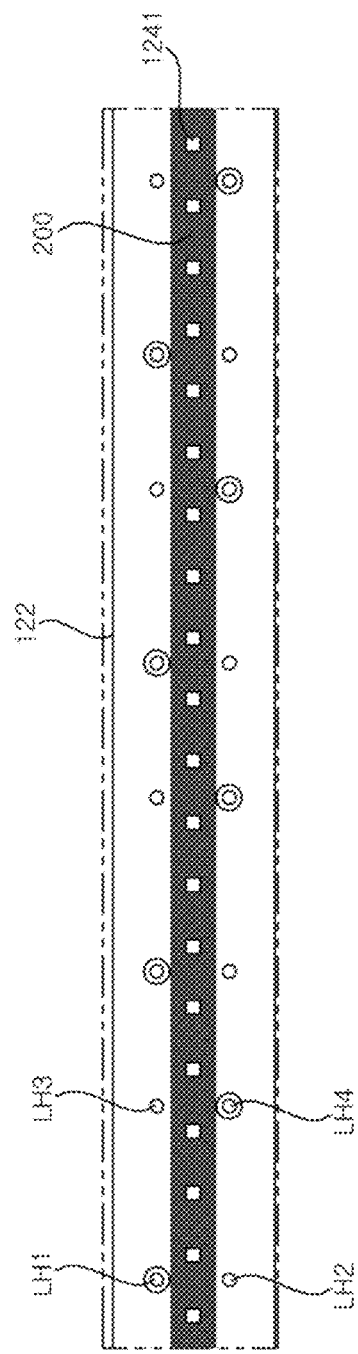

Referring to FIG. 14, the optical layer 200 may be formed around the light source 1241. For example, the optical layer 200 may be located on the substrate 122 and may have a rectangular shape that surrounds (or is to surround) the light source 1241 and extends along a length direction. For example, the light sources 1241 may be sequentially (or successively) disposed inside the optical layer 200 along the length direction of the optical layer 200.

For example, the optical layer 200 may include a yellow phosphor. As another example, the optical layer 200 may include a black material. Material or phosphor contained in the optical layer 200 for light control may vary.

Figure 15:
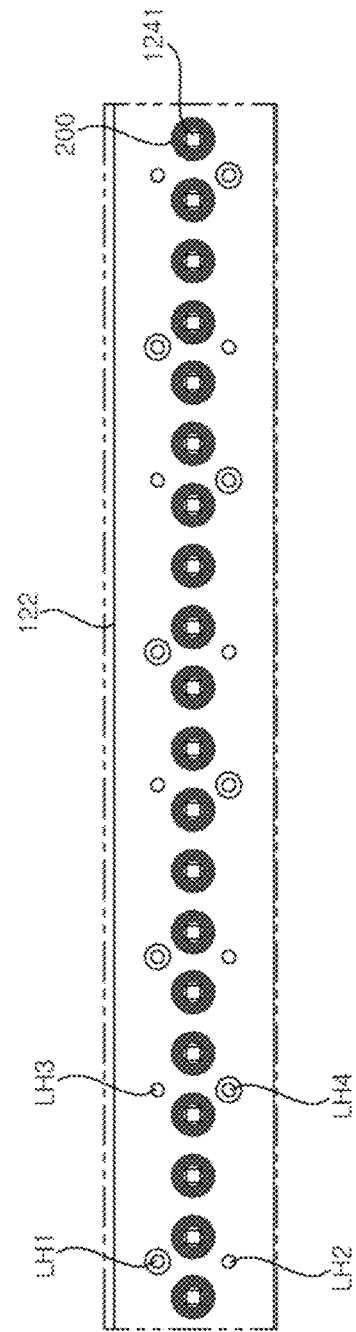

Referring to FIG. 15, the optical layer 200 may be formed around the light source 1241. For example, the optical layer 200 may be located on the substrate 122 and may have a circular shape surrounding (or to surround) the light source 1241.

For example, the optical layer 200 may include a yellow phosphor. As another example, the optical layer 200 may include a black material. Material or phosphor contained in the optical layer 200 for light control may vary.

Figure 16:
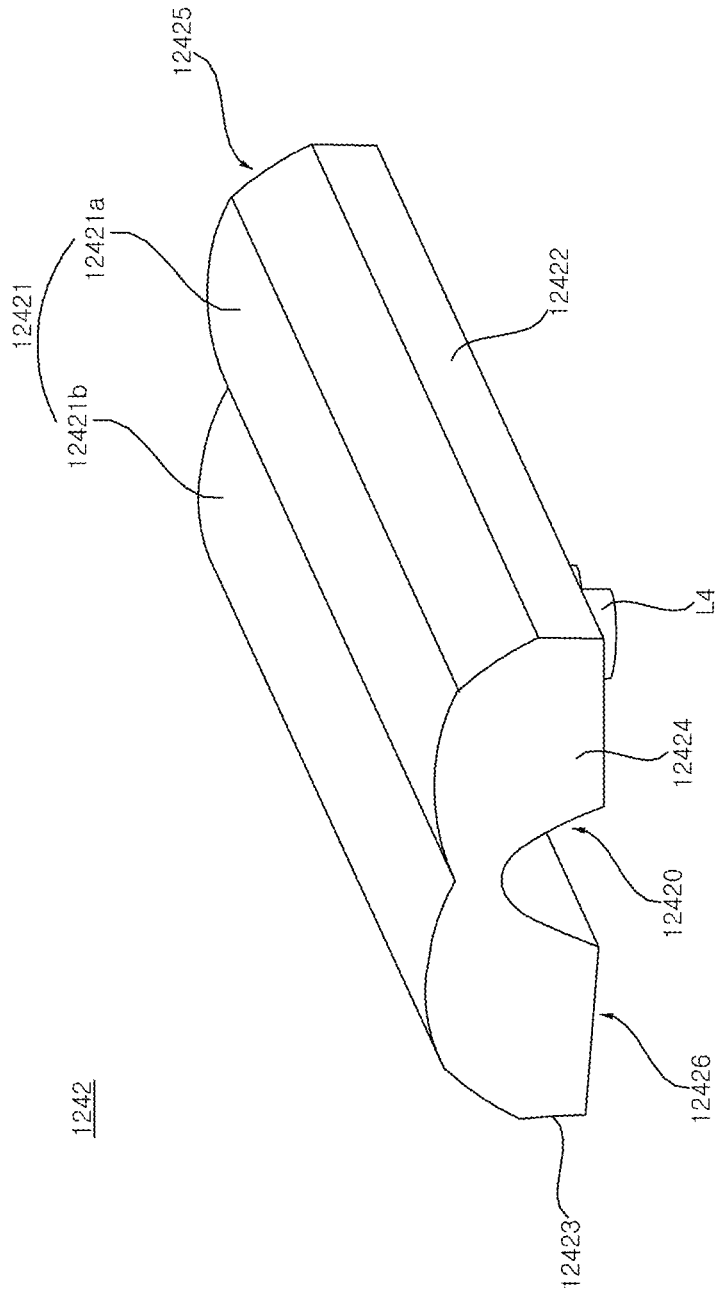
FIGS. 16 to 18 are diagrams illustrating examples of a lens according to embodiments of the present disclosure.
Figure 17:
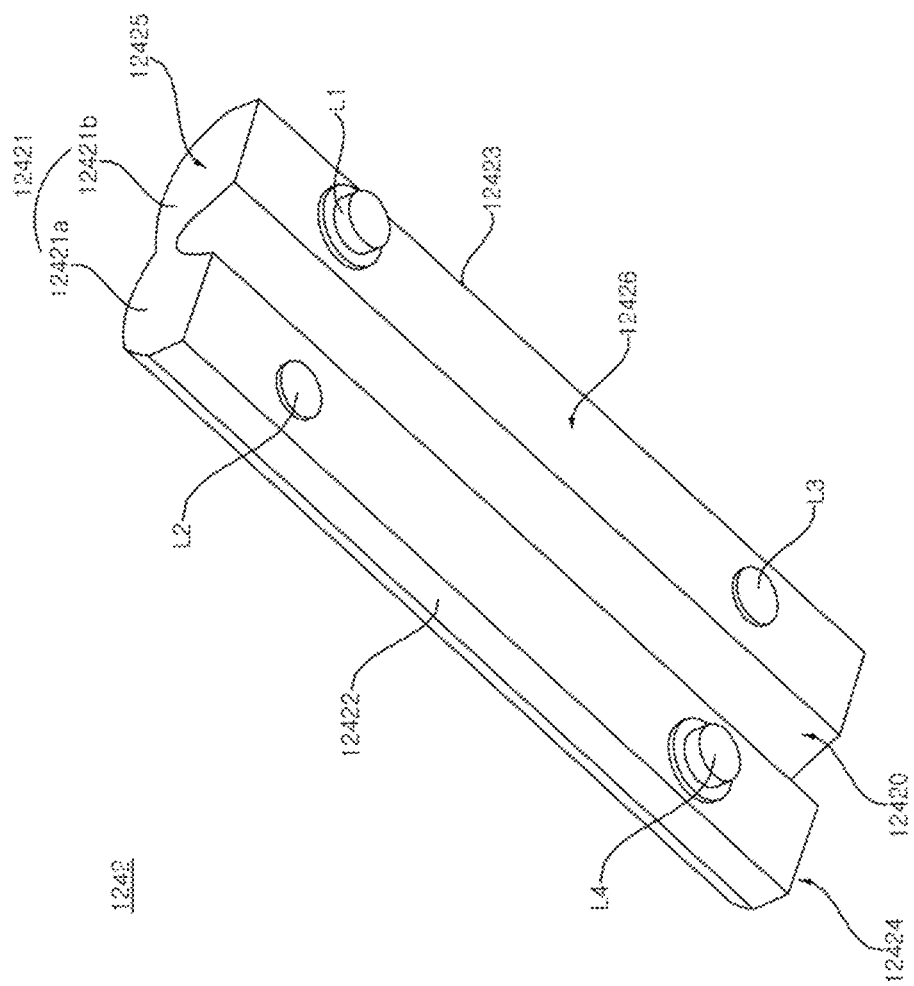

Referring to FIGS. 16 and 17, the lens 1242 may include an upper portion 12421, a lower portion 12426, a side portion 12424, 12425, and a receiving portion 12420. The lens 1242 may have a bar shape that is extended (or elongated) as a whole (or in general). The upper portion 12421 may include a first dome portion 12421*a* and a second dome portion 12421*b*. The first dome portion 12421*a* may have a loop shape that is extended long (or elongated) and convex. The second dome portion 12421*b* may have a loop shape that is extended long (or elongated) and convex and may be located adjacent to the first dome portion 12421*a* in parallel with the first dome portion 12421*a*. The first dome portion 12421*a* and the second dome portion 12421*b* may form an upper surface of the lens 1242.

The lower portion 12426 may have a lower surface which is flat and faces the upper portion 12421. The lower surface may have a rectangular shape as a whole (or in general). The receiving portion 12420 may be formed while the lower surface is recessed from the lower portion 12426 toward the upper portion 12421. The receiving portion 12420 may be formed while the lower portion 12426 is cut-out (e.g., partially cut-out). The receiving portion 12420 may form a canal in the lower portion 12426.

The side portions 12422, 12423, 12424, and 12425 may connect the upper portion 12421 and the lower portion 12426. The side portion 12422, 12423, 12424, and 12425 may form side surfaces of the lens 1242. The first side surface 12422 may connect an upper surface formed by the first dome portion 12421*a* and a lower surface of the lower portion 12426, and may have a rectangular shape as a whole (or in general). The second side surface 12423 may connect an upper surface formed by the second dome portion 12421*b* and a lower surface of the lower portion 12426, and may have a rectangular shape as a whole (or in general). The third side surface 12424 may connect the first side surface 12422 and the second side surface 12423 between the upper surface and the lower surface of the lens 1242. The fourth side surface 12425 may face the third side surface 12424, and may connect the first side surface 12422 and the second side surface 12423 between the upper surface and the lower surface. The third side surface 12424 and the fourth side surface 12425 may show (or indicate) a cross-sectional shape of the lens 1242.

The leg L may be fixed to or formed on the lower surface of the lens 1242. The legs L may be plural. A plurality of legs L may include a first leg L1, a second leg L2, a third leg L3, and a fourth leg L4. The first leg L1 may be located adjacent to a corner formed by the second side surface 12423 and the fourth side surface 12425. The second leg L2 may be located adjacent to a corner formed by the first side surface 12422 and the fourth side surface 12425. The third leg L3 may be located adjacent to a corner formed by the second side surface 12423 and the third side surface 12424. The fourth leg L4 may be located adjacent to a corner formed by the first side surface 12422 and the third side surface 12424.

The height of the first leg L1 may be greater than the height of the second leg L2. The height of the fourth leg L4 may be greater than the height of the third leg L3. The height of the first leg L1 may be substantially the same as the height of the fourth leg L4. The height of the second leg L2 may be substantially the same as the height of the third leg L3. The first leg L1 and/or the fourth leg L4 may be inserted into a leg hole LH1, LH4 of the substrate 122 to be fixed or adhered, and the second leg L2 and/or the third leg L3 may be fixed or adhered to the leg hole LH2, LH3 of the substrate 122. Accordingly, detachment of the lens 1242 can be prevented.

Figure 18:
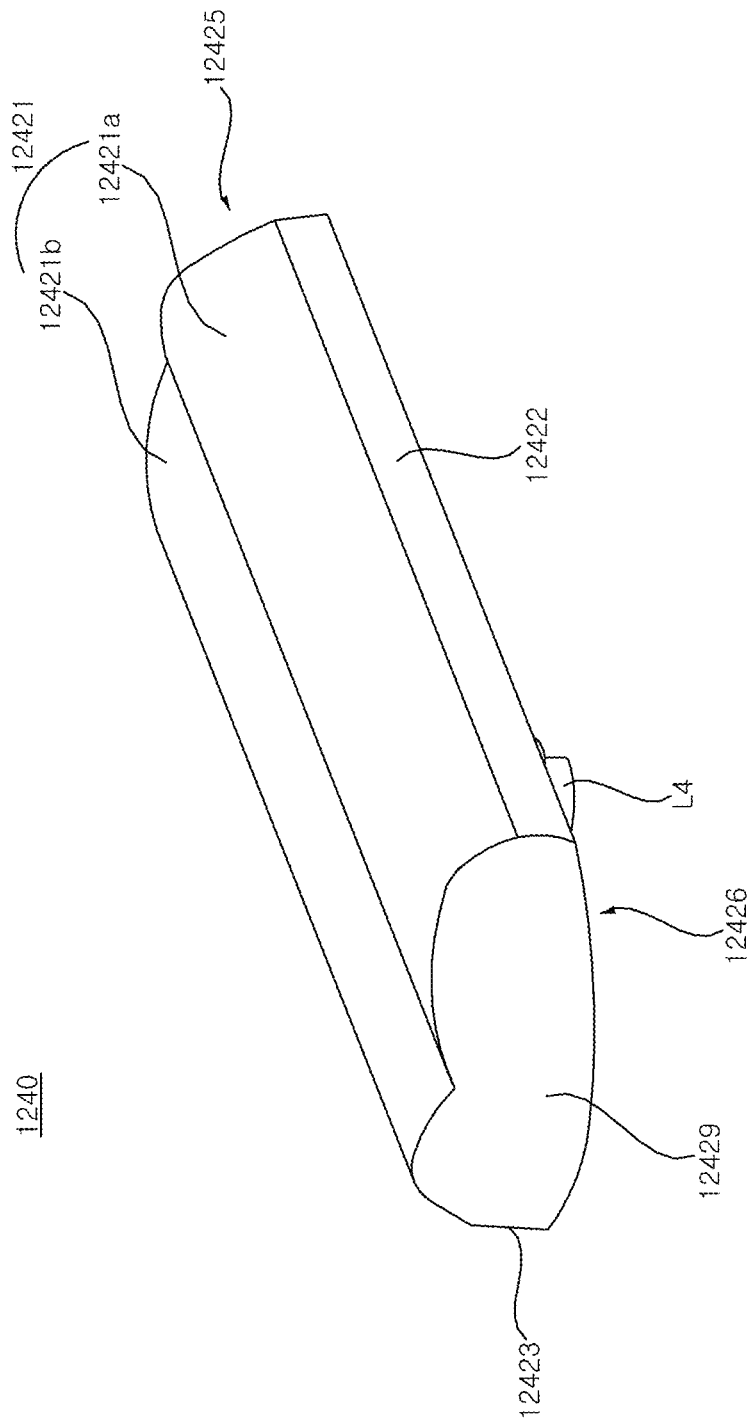

Referring to FIG. 18, the lens 1242 may have a side curved surface 12429. The side curved surface 12429 may be formed at one end of the lens 1242 with respect to the length direction of the lens 1242. For example, the third side surface 12424 of the above mentioned lens 1242 may be curve-processed to form a side curved surface 12429. The side curved surface 12429 may connect the first side surface 12422, the second side surface 12423, an upper surface of the upper portion 12421, and a lower surface of the lower portion 12426.

The side curved surface 12429 of the lens 1242 may be located adjacent to the first short side SS1 and/or the second short side SS2 of the frame 130 (refer to FIG. 4). The side curved surface 12429 of the lens 1242 may face the first short side SS1 and/or the second short side SS2 of the frame 130.

Accordingly, the outflow efficiency of a light that optical cycles (or optically cycles) inside the lens 1242 through the side curved surface 12429 of the lens 1242 may be improved. That is, (display at) a dark area or dark line formed in the first short side SS1 (refer to FIG. 4) and/or the second short side SS2 of the display device may be improved.

Figure 19:
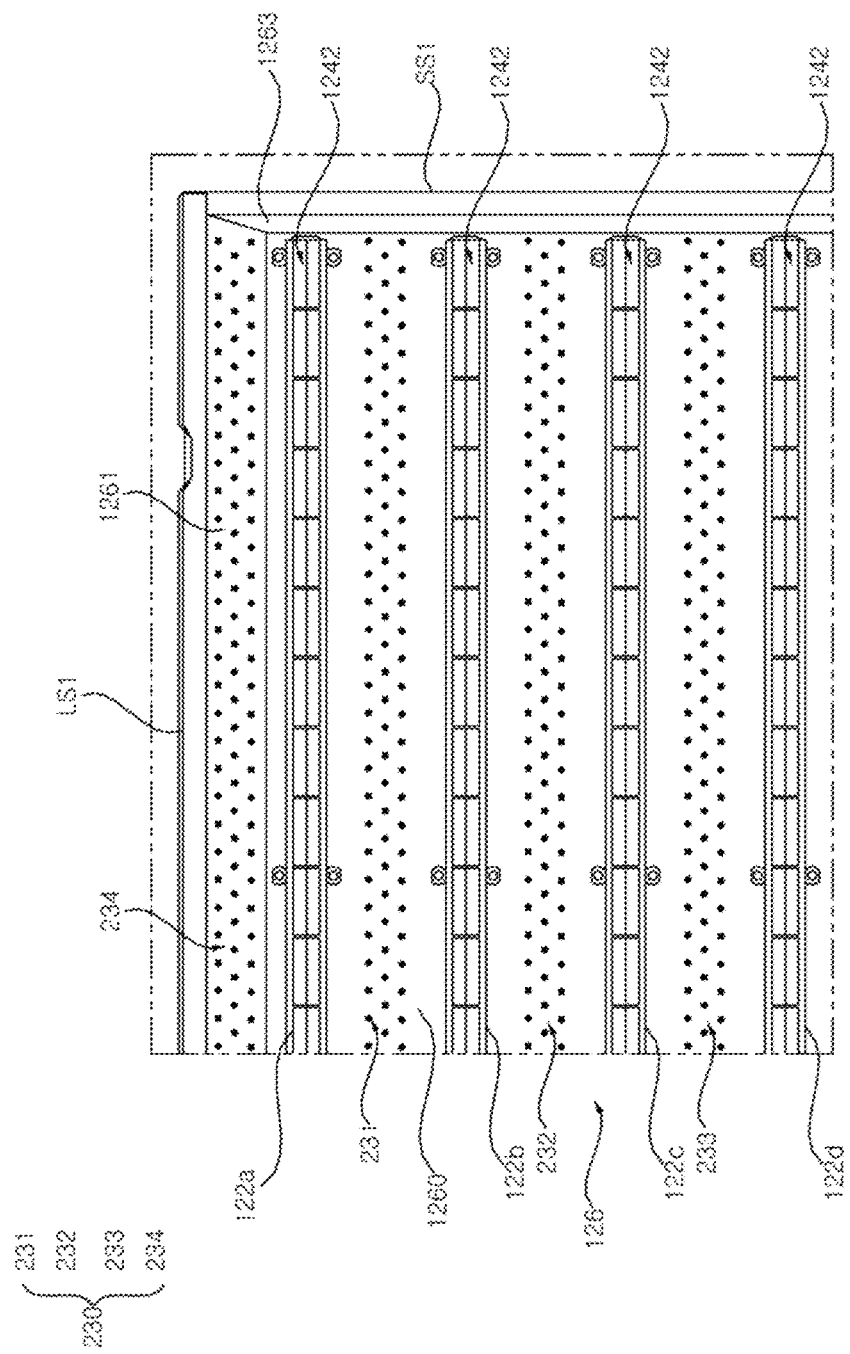
FIGS. 19 to 22 are diagrams illustrating examples of a reflective sheet according to embodiments of the present disclosure.

Referring to FIG. 19, an optical pattern 230 may be located in the reflective sheet 126. The optical pattern 230 may be referred to as an absorbing light pattern 230. The substrate 122 and the lens 1242 may be disposed to extend along the left and right direction of the reflective sheet 126. A plurality of substrates 122 may be sequentially (or successively) disposed in the vertical direction of the reflective sheet 126. The lenses 1242 may be sequentially (or successively) disposed on the substrate 122 to extend along the left and right direction of the reflective sheet 126. For example, the lens 1242 may cover four or five light sources 1241.

The first substrate 122a may be disposed adjacent to the first long side LS1 and parallel to the first long side LS1. The second substrate 122b may be disposed adjacent to the first substrate 122a with respect to the vertical direction and parallel to the first long side LS1. The third substrate 122c may be adjacent to the second substrate 122b with respect to the vertical direction and may be disposed parallel to the first long side LS1. The fourth substrate 122d may be disposed adjacent to the third substrate 122c with respect to the vertical direction and parallel to the first long side LS1.

The absorbing light pattern 230 may be formed in the central portion 1260 of the reflective sheet 126 between substrates 122 (e.g., between the first substrate 122a and the second substrate 122b). The absorbing light pattern 230 may include a black material and may be printed on the reflective sheet 126.

A first absorbing light pattern 231 may be formed in (or at) the central portion 1260 of the reflective sheet 126 between the first substrate 122a and the second substrate 122b. A second absorbing light pattern 232 may be formed in the central portion 1260 of the reflective sheet 126 between the second substrate 122b and the third substrate 122c. A third absorbing light pattern 233 may be formed in the central portion 1260 of the reflective sheet 126 between the third substrate 122c and the fourth substrate 122d.

Accordingly, it is possible to adjust the amount of light or the intensity of light in (or at) a bright portion formed by overlapping of light refracted or reflected from the lens 1242 between substrates 122 (e.g., between adjacent substrates 122).

Figure 20:
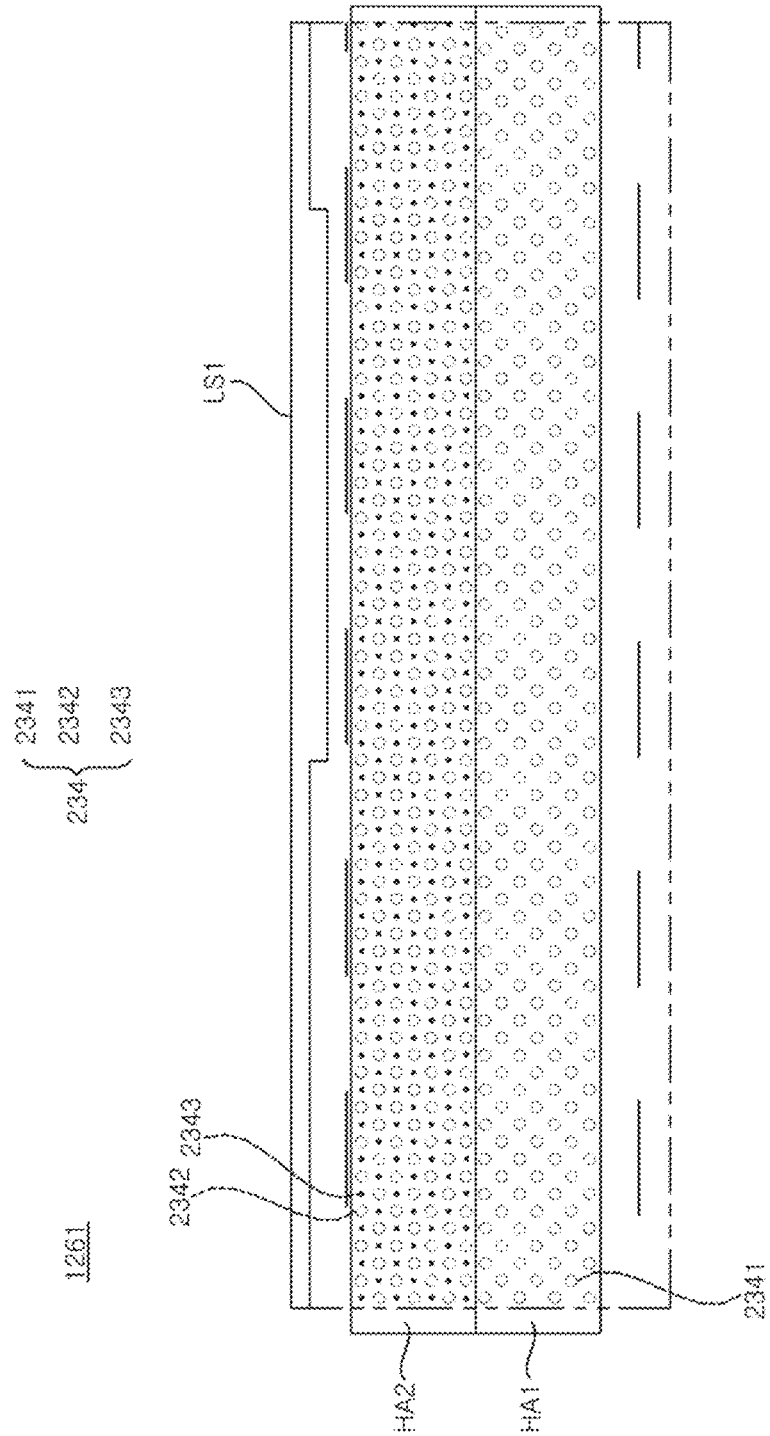

Referring to FIG. 20 together with FIG. 19, the optical pattern 234 may be formed in (or at) the side portion 1261. The side portion 1261 may have a bright portion formed by light refracted by the lens 1242, and the optical pattern 234 may adjust the amount of light or the light intensity of (or at) the bright portion of the side portion 1261. The optical pattern 234 formed in the side portion 1261 may be referred to as a side pattern 234.

The side pattern 234 may include a first dot area HA1 and a second dot area HA2. The dots 2341 of the first dot area HA1 may be different from the dots 2342 and 2343 of the second dot area HA2. The first dot area HA1 may be formed along the first long side LS1 or the second long side LS2 while being adjacent to the first long side LS1 or the second long side LS2. The second dot area HA2 may be located between the first long side LS1 and the first dot area HAL The first dot area HA1 may be referred to as a first horizontal dot area HAL and the second dot area HA2 may be referred to as a second horizontal dot area HA2.

The dots 2341 of the first dot area HA1 may have a circular shape. The dots 2341 printed in the first dot area HA1 may have the same size, or may have different sizes.

The dots 2342 and 2343 of the second dot area HA2 may include a circle dot 2342 and a point dot 2343. The circle dots 2342 and the point dots 2343 may be alternately disposed. A diameter of the circle dot 2342 may be substantially the same as or greater than a diameter of the dots 2341 located in the first dot area HAL A diameter of the point dots 2343 may be smaller than a diameter of the circle dots 2342, and may be smaller than a diameter of the dots 2341 located in the first dot area HAL The density in number of the dots 2341 of the first dot area HA1 may be smaller than the density in number of the dots 2342 and 2343 of the second dot area HA2.

Accordingly, the amount of absorbed light at the second dot area HA2 may be greater than the amount of absorbed light at the first dot area HA1.

Figure 21:
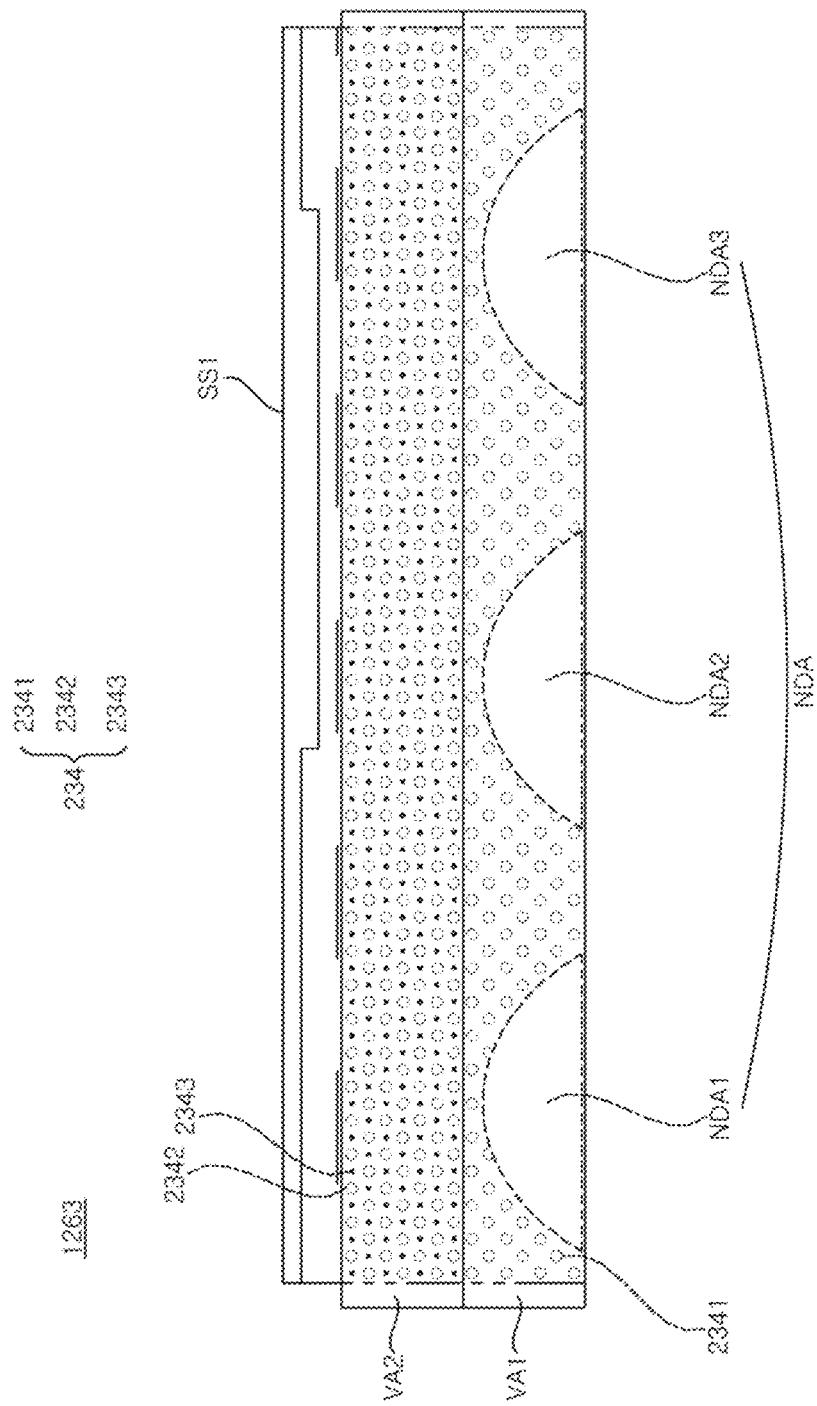

Referring to FIG. 21 together with FIG. 19, the optical pattern 234 may be formed in (or at) the side portion 1263. The side portion 1263 may have a bright portion formed by light refracted by the lens 1242, and the optical pattern 234 may adjust the amount of light or the light intensity of (or at) the bright portion of the side portion 1261. The optical pattern 234 formed in the side portion 1261 may be referred to as a side pattern 234.

The side pattern 234 may include a first dot area VA1 and a second dot area VA2. The dots 2341 of the first dot area VA1 may be different from the dots 2342 and 2343 of the second dot area VA2. The first dot area VA1 may be adjacent to the first short side SS1 or the second short side SS2 and formed along the first short side SS1 or the second short side SS2. The second dot area VA2 may be located between the first short side SS1 and the first dot area VA1. The first dot area VA1 may be referred to as a first vertical dot area VA1, and the second dot area VA2 may be referred to as a second vertical dot area VA2.

The dots 2341 of the first dot area VA1 may have a circular shape. The dots 2341 printed in the first dot area VA1 may have the same size, or may have different sizes.

The dots 2342 and 2343 of the second dot area VA2 may include a circle dot 2342 and a point dot 2343. The circle dots 2342 and the point dots 2343 may be alternately disposed. The diameter of the circle dot 2342 may be substantially the same as or greater than the diameter of the dots 2341 located in the first dot area VA1. A diameter of the point dots 2343 may be smaller than a diameter of the circle dots 2342, and may be smaller than a diameter of the dots 2341 located in the first dot area VA1. The density in number of the dots 2341 of the first dot area VA1 may be smaller than the density in number of the dots 2342 and 2343 of the second dot area VA2.

Accordingly, the amount of absorbed light at the second dot area VA2 may be greater than the amount of absorbed light at the first dot area VA1.

A reflective area NDA may be formed in (or at) the first dot area VA1. The reflective area NDA may be an area in which dots 2341 are not formed. The reflective area NDA may be referred to as a non-dot area. The reflective area NDA may be plural. A plurality of reflective areas NDA may be located along the first short side SS1. A plurality of reflective areas NDA may be spaced apart from each other. A first reflective area NDA1 may be located between the first substrate 122a and the second substrate 122b, a second reflective area NDA2 may be located between the second substrate 122b and the third substrate 122c, and a third reflective area NDA3 may be located between the third substrate 122c and the fourth substrate 122d.

Accordingly, (display at) a partially formed dark area may be improved.

Figure 22:
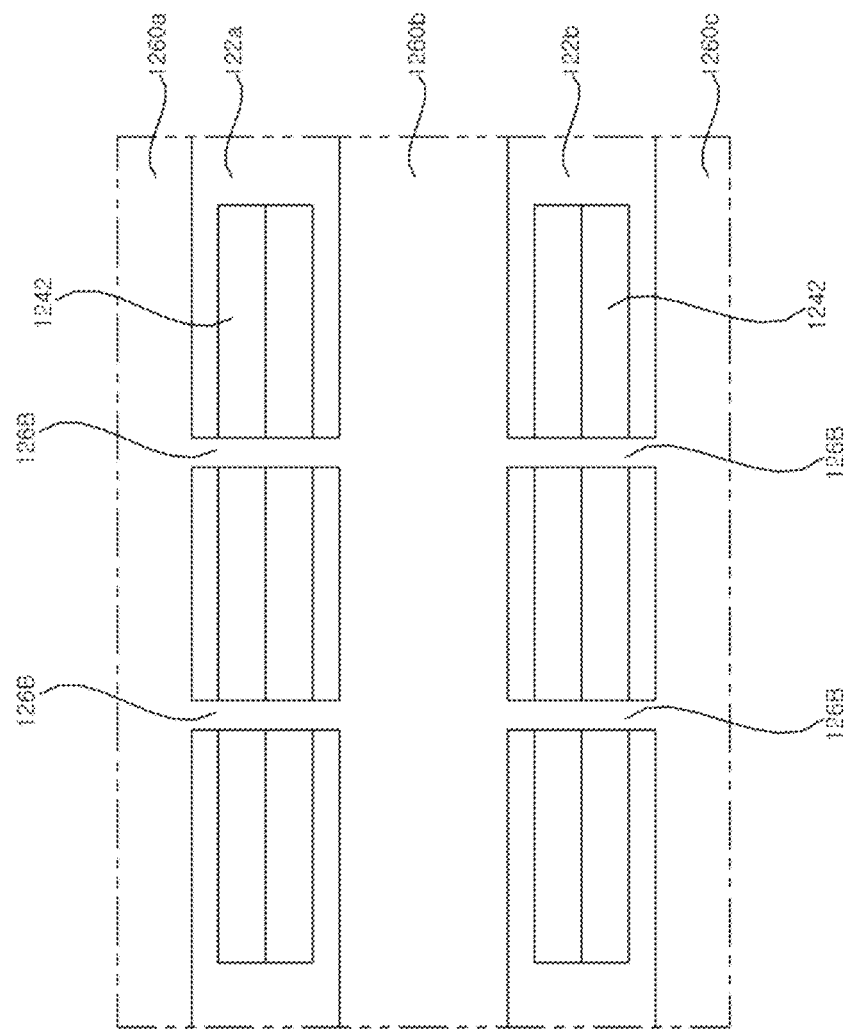

Referring to FIG. 22, the lenses 1242 may be spaced apart from each other. For example, the spaced distance of the lenses 1242 may be about 1.2 millimeters. The reflective sheet 126 may include a central portion 1260 and a bridge 126B. The reflective sheet 126 may include a plurality of central portions 1260. The second central portion 1260b may be located between the first substrate 122a and the second substrate 122b. The first central portion 1260a may face the second central portion 1260b with respect to the first substrate 122a. The third central portion 1260c may face the second central portion 1260b with respect to the second substrate 122b.

The bridges 126B may connect the first central portion 1260a and the second central portion 1260b. In addition, the bridges 126B may connect the second central portion 1260b and the third central portion 1260c. The bridges 126B may be located between lenses 1242.

Accordingly, (display at) the dark area that can be formed between the lenses 1242 may be improved.

Referring to FIGS. 1 to 22, according to an embodiment of the present disclosure, a display device may include: a display panel; a frame located behind the display panel, and to which the display panel is coupled; a substrate located between the display panel and the frame, fixed to the frame, and extending along a length direction; a plurality of light sources successively mounted on the substrate along the length direction of the substrate; and a lens extending along the length direction of the substrate to cover the plurality of light sources, and fixed to the substrate, wherein the lens includes: a first dome portion which forms an upper surface, and is convex; a second dome portion which forms an upper surface, and is adjacent to the first dome portion; a receiving portion which is recessed from a lower surface of the lens toward the upper surface, and in which the plurality of light sources are located.

According to a further embodiment of the present disclosure, a boundary formed by the first dome portion and the second dome portion may be parallel to the substrate.

According to a further embodiment of the present disclosure, the substrate may have: a first leg hole which is located adjacent to a first light source of the plurality of light sources; a second leg hole which faces the first leg hole with respect to the first light source; a third leg hole which is located adjacent to a second light source of the plurality of light sources; and a fourth leg hole which faces the third leg hole with respect to the second light source, wherein a depth of the first leg hole may be greater than a depth of the second leg hole, and a depth of the fourth leg hole may be greater than a depth of the third leg hole.

According to a further embodiment of the present disclosure, the lens may include: a first leg which protrudes from a lower surface of the lens and is inserted into the first leg hole; a second leg which protrudes from the lower surface of the lens and is inserted into the second leg hole; a third leg which protrudes from the lower surface of the lens and is inserted into the third leg hole; and a fourth leg which protrudes from the lower surface of the lens and is inserted into the fourth leg hole, wherein a height of the first leg may be greater than a height of the second leg, and a height of the fourth leg may be greater than a height of the third leg.

According to a further embodiment of the present disclosure, the substrate may include: a first optical line extending along the length direction of the substrate and located between one long side of the substrate and the plurality of light sources; and a second optical line extending along the length direction of the substrate and located between the other long side of the substrate and the plurality of light sources.

According to a further embodiment of the present disclosure, the substrate may include a first optical pattern extending along the length direction of the substrate and located between one long side of the substrate and the plurality of light sources, wherein the first optical pattern may include: a first plurality of segments located between one long side of the substrate and the plurality of light sources; and a second plurality of segments located between the first plurality of segments and the plurality of light sources, wherein the first plurality of segments and the second plurality of segments may be alternately disposed.

According to a further embodiment of the present disclosure, the substrate may include a second optical pattern extending along the length direction of the substrate and located between the other long side of the substrate and the plurality of light sources, wherein the second optical pattern may include: a third plurality of segments located between the other long side of the substrate and the plurality of light sources; and a fourth plurality of segments located between the third plurality of segments and the plurality of light sources, wherein the third plurality of segments and the fourth plurality of segments may be alternately disposed.

According to a further embodiment of the present disclosure, the substrate may include an optical layer located around each of the plurality of light sources and including a yellow-based phosphor.

According to a further embodiment of the present disclosure, the display device may further include: a reflective sheet located on the frame and configured to reflect light provided from the plurality of light sources; and an absorbing light pattern located on the reflective sheet around the substrate, wherein the substrate may include: a first substrate extending along one side of the frame and located on the frame; and a second substrate extending parallel to the first substrate and located on the frame, wherein the absorbing light pattern may be located between the first substrate and the second substrate.

According to a further embodiment of the present disclosure, the display device may further include a side pattern located between one side of the frame and the first substrate, located on the reflective sheet, and configured to absorb a portion of the light provided from the plurality of light sources.

According to a further embodiment of the present disclosure, the side pattern may include: a first dot area in which dots are located, which is located between one side of the frame and the first substrate; and a second dot area in which dots are located, and which is located between one side of the frame and the first dot area, wherein a size of the dots located in the first dot area may be different from a size of the dots located in the second dot area.

According to a further embodiment of the present disclosure, a density in number of the dots located in the first dot area may be smaller than a density in number of the dots located in the second dot area.

According to a further embodiment of the present disclosure, the dots located in the first dot area may include circle dots, and the dots located in the second dot area may include circle dots and point dots.

According to a further embodiment of the present disclosure, a size of the circle dots located in the first dot area may be substantially the same as a size of the circle dots located in the second dot area, and a size of the point dots located in the second dot area may be smaller than the size of the circle dots located in the second dot area.

According to a further embodiment of the present disclosure, the reflective sheet may include a bridge extending across the lens on the substrate.

The effect of the display device according to one or more embodiments the present disclosure will be described as follows.

According to at least one embodiment of the present disclosure, it is possible to improve image quality of a display device.

According to at least one embodiment of the present disclosure, it is possible to provide a display device capable of improving luminance and light uniformity of a backlight unit.

According to at least one embodiment of the present disclosure, it is possible to provide a display device capable of effectively controlling light provided from the backlight unit.

According to at least one embodiment of the present disclosure, it is possible to provide a display device capable of reducing the number of light sources while improving the luminance of the backlight unit.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments that can be devised by those skilled in the art will fall within the scope of the principles of the invention. More particularly, various variations and modifications are possible in the component parts and/or arrangements of the subject combination arrangement within the scope of the invention, the drawings and the appended claims. In addition to variations and modifications in the component parts and/or arrangements, alternative uses will also be apparent to those skilled in the art.

What is claimed is:

1. A display device comprising:
a display panel;
a frame located behind the display panel, and to which the display panel is coupled;
a substrate located between the display panel and the frame, fixed to the frame, and extending along a length direction;
a plurality of light sources successively mounted on the substrate along the length direction of the substrate; and
a lens extending along the length direction of the substrate to cover the plurality of light sources, and fixed to the substrate,
wherein the lens comprises:
a first dome portion which forms a part of an upper surface of the lens, and is convex;
a second dome portion which forms a remaining part of the upper surface, and is adjacent to the first dome portion; and
a receiving portion recessed from a lower surface of the lens toward the upper surface, and in which the plurality of light sources are located,
wherein the substrate has:
a first leg hole which is located adjacent to a first light source of the plurality of light sources;
a second leg hole which faces the first leg hole with respect to the first light source;
a third leg hole which is located adjacent to a second light source of the plurality of light sources; and
a fourth leg hole which faces the third leg hole with respect to the second light source,
wherein a depth of the first leg hole is greater than a depth of the second leg hole, and
wherein a depth of the fourth leg hole is greater than a depth of the third leg hole.

2. The display device of claim 1, wherein a boundary formed by the first dome portion and the second dome portion is parallel to the substrate.

3. The display device of claim 1, wherein the lens further comprises:
a first leg which protrudes from the lower surface of the lens and is inserted into the first leg hole;
a second leg which protrudes from the lower surface of the lens and is inserted into the second leg hole;
a third leg which protrudes from the lower surface of the lens and is inserted into the third leg hole; and
a fourth leg which protrudes from the lower surface of the lens and is inserted into the fourth leg hole,
wherein a height of the first leg is greater than a height of the second leg, and
wherein a height of the fourth leg is greater than a height of the third leg.

4. The display device of claim 1, wherein the substrate comprises:
   a first optical line extending along the length direction of the substrate and located between a first long side of the substrate and the plurality of light sources; and
   a second optical line extending along the length direction of the substrate and located between a second long side of the substrate and the plurality of light sources.

5. The display device of claim 1, wherein the substrate comprises a first optical pattern extending along the length direction of the substrate and located between a first long side of the substrate and the plurality of light sources,
   wherein the first optical pattern comprises:
      a first plurality of segments located between the first long side of the substrate and the plurality of light sources; and
      a second plurality of segments located between the first plurality of segments and the plurality of light sources, and
   wherein the first plurality of segments and the second plurality of segments are alternately disposed.

6. The display device of claim 5, wherein the substrate further comprises a second optical pattern extending along the length direction of the substrate and located between a second long side of the substrate and the plurality of light sources,
   wherein the second optical pattern comprises:
      a third plurality of segments located between the second long side of the substrate and the plurality of light sources; and
      a fourth plurality of segments located between the third plurality of segments and the plurality of light sources,
   wherein the third plurality of segments and the fourth plurality of segments are alternately disposed.

7. The display device of claim 1, wherein the substrate comprises an optical layer located around each of the plurality of light sources and comprising a yellow-based phosphor.

8. The display device of claim 1, further comprising:
   a reflective sheet located on the frame and configured to reflect light provided from the plurality of light sources; and
   an absorbing light pattern located on the reflective sheet around the substrate,
   wherein the substrate comprises:
      a first substrate extending along a first side of the frame and located on the frame; and
      a second substrate extending parallel to the first substrate and located on the frame,
   wherein the absorbing light pattern is located between the first substrate and the second substrate.

9. A display device comprising:
   a display panel;
   a frame located behind the display panel, and to which the display panel is coupled;
   a substrate located between the display panel and the frame, fixed to the frame, and extending along a length direction;
   a plurality of light sources successively mounted on the substrate along the length direction of the substrate;
   a lens extending along the length direction of the substrate to cover the plurality of light sources, and fixed to the substrate,
   wherein the lens comprises:
      a first dome portion which forms a part of an upper surface of the lens, and is convex;
      a second dome portion which forms a remaining part of the upper surface, and is adjacent to the first dome portion; and
      a receiving portion recessed from a lower surface of the lens toward the upper surface, and in which the plurality of light sources are located;
   a reflective sheet located on the frame and configured to reflect light provided from the plurality of light sources; and
   an absorbing light pattern located on the reflective sheet around the substrate,
   wherein the substrate comprises:
      a first substrate extending along a first side of the frame and located on the frame; and
      a second substrate extending parallel to the first substrate and located on the frame, and
   wherein the absorbing light pattern is located between the first substrate and the second substrate.

10. The display device of claim 9, further comprising a side pattern located between the first side of the frame and the first substrate, located on the reflective sheet, and configured to absorb a portion of the light provided from the plurality of light sources.

11. The display device of claim 10, wherein the side pattern comprises:
    a first dot area in which dots are located, wherein the first dot area is located between the first side of the frame and the first substrate; and
    a second dot area in which dots are located, wherein the second dot area is located between the first side of the frame and the first dot area,
    wherein a size of the dots located in the first dot area is different from a size of the dots located in the second dot area.

12. The display device of claim 11, wherein a density in number of the dots located in the first dot area is smaller than a density in number of the dots located in the second dot area.

13. The display device of claim 12, wherein the dots located in the first dot area comprises circle dots, and
    wherein the dots located in the second dot area comprises circle dots and point dots.

14. The display device of claim 13, wherein a size of the circle dots located in the first dot area is substantially same as a size of the circle dots located in the second dot area, and
    wherein a size of the point dots located in the second dot area is smaller than the size of the circle dots located in the second dot area.

15. The display device of claim 9, wherein the reflective sheet comprises a bridge extending across the lens on the substrate.

16. A display device comprising:
    a display panel;
    a frame located behind the display panel, and to which the display panel is coupled;
    a substrate located between the display panel and the frame, fixed to the frame, and extending along a length direction;
    a plurality of light sources successively mounted on the substrate along the length direction of the substrate; and
    a lens extending along the length direction of the substrate to cover the plurality of light sources, and fixed to the substrate,
    wherein the lens comprises:
       a first dome portion which forms a part of an upper surface of the lens, and is convex;

a second dome portion which forms a remaining part of the upper surface, and is adjacent to the first dome portion; and a receiving portion recessed from a lower surface of the lens toward the upper surface, and in which the plurality of light sources are located, wherein the substrate comprises a first optical pattern extending along the length direction of the substrate and located between a first long side of the substrate and the plurality of light sources, wherein the first optical pattern comprises:

a first plurality of segments located between the first long side of the substrate and the plurality of light sources; and a second plurality of segments located between the first plurality of segments and the plurality of light sources, and wherein the first plurality of segments and the second plurality of segments are alternately disposed.

17. The display device of claim 16, wherein the substrate further comprises a second optical pattern extending along the length direction of the substrate and located between a second long side of the substrate and the plurality of light sources, wherein the second optical pattern comprises:

a third plurality of segments located between the second long side of the substrate and the plurality of light sources; and a fourth plurality of segments located between the third plurality of segments and the plurality of light sources, and wherein the third plurality of segments and the fourth plurality of segments are alternately disposed.

* * * * *